(12) United States Patent
Sun et al.

(10) Patent No.: US 12,150,371 B2
(45) Date of Patent: Nov. 19, 2024

(54) ORGANIC LIGHT EMITTING DIODE DISPLAY SUBSTRATE, PREPARATION METHOD AND REPAIR METHOD THEREFOR AND ORGANIC LIGHT EMITTING DIODE DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Shi Sun, Beijing (CN); Xuewu Xie, Beijing (CN); Yu Ai, Beijing (CN); Bowen Liu, Beijing (CN); Hao Liu, Beijing (CN); Yubao Kong, Beijing (CN); Ameng Zhang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 697 days.

(21) Appl. No.: 17/288,927

(22) PCT Filed: Aug. 20, 2020

(86) PCT No.: PCT/CN2020/110304
§ 371 (c)(1),
(2) Date: Apr. 27, 2021

(87) PCT Pub. No.: WO2021/032169
PCT Pub. Date: Feb. 25, 2021

(65) Prior Publication Data
US 2021/0384481 A1    Dec. 9, 2021

(30) Foreign Application Priority Data
Aug. 21, 2019    (CN) .......................... 201910775157.4

(51) Int. Cl.
*H10K 71/00* (2023.01)
*H10K 50/824* (2023.01)
(Continued)

(52) U.S. Cl.
CPC ........... *H10K 71/00* (2023.02); *H10K 50/824* (2023.02); *H10K 59/1213* (2023.02);
(Continued)

(58) Field of Classification Search
CPC ....... H10K 59/10–221; H10K 59/8052; H10K 59/80522; H10K 71/00; H10K 71/861; H10K 50/824; H01L 27/1214
See application file for complete search history.

(56) References Cited

U.S. PATENT DOCUMENTS

| 2007/0120476 A1 | 5/2007 | Park et al. |
| 2007/0139330 A1 | 6/2007 | Wu et al. |

(Continued)

FOREIGN PATENT DOCUMENTS

| CN | 1971939 A | 5/2007 |
| CN | 1987571 A | 6/2007 |

(Continued)

OTHER PUBLICATIONS

International Search Report for PCT/CN2020/110304 Mailed Nov. 30, 2020.
(Continued)

*Primary Examiner* — Laura M Menz
*Assistant Examiner* — Candice Chan
(74) *Attorney, Agent, or Firm* — Ling Wu; Stephen Yang; Ling and Yang Intellectual Property

(57) ABSTRACT

A display substrate, a preparation method and a repair method thereof, and a display apparatus. The display substrate includes a driver circuit layer and an emissive structure layer overlappingly disposed on a base, the driver
(Continued)

circuit layer including a drive transistor, an auxiliary cathode wire and a repair electrode, an anode of the emissive structure layer being connected to a drain electrode of the drive transistor, a cathode of the emissive structure layer being connected to the auxiliary cathode wire, and the repair electrode being configured so as to connect the drain electrode of the drive transistor and the auxiliary cathode wire when repairing a bright spot defect.

18 Claims, 12 Drawing Sheets

(51) Int. Cl.
  *H10K 59/121* (2023.01)
  *H10K 59/131* (2023.01)
  *H01L 27/12* (2006.01)
  *H10K 59/12* (2023.01)
(52) U.S. Cl.
  CPC ........ *H10K 59/131* (2023.02); *H01L 27/1214* (2013.01); *H10K 59/1201* (2023.02); *H10K 71/861* (2023.02)

(56) References Cited

U.S. PATENT DOCUMENTS

| | | | |
|---|---|---|---|
| 2009/0061720 A1 | 3/2009 | Fujimaki | |
| 2010/0207106 A1 | 8/2010 | Lhee et al. | |
| 2012/0164761 A1 | 6/2012 | Yamazaki et al. | |
| 2013/0256638 A1 | 10/2013 | Uesugi et al. | |
| 2013/0256723 A1 | 10/2013 | Jin et al. | |
| 2014/0209891 A1 | 7/2014 | Hiraoka et al. | |
| 2014/0291624 A1 | 10/2014 | Kim et al. | |
| 2016/0178939 A1 | 6/2016 | Cheng et al. | |
| 2019/0027549 A1 | 1/2019 | Ai et al. | |
| 2020/0176541 A1 | 6/2020 | Xu et al. | |

FOREIGN PATENT DOCUMENTS

| | | |
|---|---|---|
| CN | 101384110 A | 3/2009 |
| CN | 104536166 A | 4/2015 |
| CN | 105374843 A | 3/2016 |
| CN | 107221287 A | 9/2017 |
| CN | 107464525 A | 12/2017 |
| CN | 108258007 A | 7/2018 |
| CN | 108376697 A | 8/2018 |
| CN | 108511506 A | 9/2018 |
| CN | 208111487 U | 11/2018 |
| CN | 110459578 A | 11/2019 |
| EP | 2988292 A1 | 2/2016 |
| JP | 2003-233329 A | 8/2003 |
| KR | 10-2018-0004375 A | 1/2018 |
| WO | 2013038450 A1 | 3/2013 |

OTHER PUBLICATIONS

Office Action dated Apr. 19, 2021 for Chinese Patent Application No. 201910775157.4 and English Translation.
Office Action dated Jun. 24, 2021 for Chinese Patent Application No. 201910775157.4 and English Translation.
Decision of Rejection dated Oct. 19, 2021 for Chinese Patent Application No. 201910775157.4 and English Translation.

ORGANIC LIGHT EMITTING DIODE DISPLAY SUBSTRATE, PREPARATION METHOD AND REPAIR METHOD THEREFOR AND ORGANIC LIGHT EMITTING DIODE DISPLAY APPARATUS

The present application claims the priority of Chinese patent application No. 201910775157.4, filed to the CNIPA on Aug. 21, 2019 and entitled "Display Substrate, Preparation Method and Repair Method Thereof, and Display Device", the content of which should be regarded as being incorporated herein by reference.

TECHNICAL FIELD

Embodiments of the present disclosure relate to, but are not limited to, the field of display technology, and particularly relates to a display substrate, a preparation method and a repair method thereof, and a display device.

BACKGROUND

Organic Light Emitting Diode (OLED) display devices have the advantages such as ultra-thinness, large viewing angle, active light emission, high brightness, continuous and adjustable color of emitted light, low cost, fast response, low power consumption, wide operating temperature range and flexible display, and have gradually become a promising next generation display technology. OLED can be divided into bottom emission type and top emission type according to different light-emitting directions. The bottom emission type OLED includes a light-emitting region and a drive circuit region which are arranged in parallel in a plane parallel to the panel, a light-emitting structure is arranged in the light-emitting region, and a plurality of Thin Film Transistor (TFT) and Storage Capacitors (CST) are arranged in the drive circuit region. The top emission type OLED includes a driving circuit layer and a light-emitting layer which are stacked in a plane perpendicular to the panel, the driving circuit layer includes a plurality of thin film transistors and storage capacitors, and the light-emitting layer includes a light-emitting structure. The top emission type OLED has been widely used for its high aperture ratio because its light-emitting region overlaps with the drive circuit.

In the production process of an OLED display substrate, it is inevitable that defective bright spots occur.

SUMMARY

The following is a summary of subject matter described in detail herein. This summary is not intended to limit the protection scope of the claims.

An embodiment of the present disclosure provides a display substrate, including a driving circuit layer and a light-emitting structure layer which are stacked on a substrate. The driving circuit layer includes a driving transistor, an auxiliary cathode line and a repair electrode. An anode of the light-emitting structure layer is connected with a drain electrode of the driving transistor. A cathode of the light-emitting structure layer is connected with the auxiliary cathode line. The repair electrode is arranged to connect the drain electrode of the driving transistor with the auxiliary cathode line when repairing a defective bright spot.

In an exemplary embodiment, the repair electrode is arranged in a first structural layer, the drain electrode of the driving transistor and the auxiliary cathode line are arranged in a second structural layer, and an insulating layer is arranged between the first structural layer and the second structural layer. The repair electrode and the drain electrode of the driving transistor have a first overlapping region, and the repair electrode and the auxiliary cathode line have a second overlapping region.

In an exemplary embodiment, the repair electrode is arranged in the same layer as a gate line, and the drain electrode of the driving transistor and the auxiliary cathode line are arranged in the same layer as a data line.

In an exemplary embodiment, the first overlapping region is provided with a via hole, and the drain electrode of the driving transistor is connected with the repair electrode through the via hole.

In an exemplary embodiment, the second overlapping region is provided with a via hole, and the auxiliary cathode line is connected with the repair electrode through the via hole.

In an exemplary embodiment, the repair electrode is a repair electrode line, which is parallel to the gate line, repair electrode lines and auxiliary cathode lines form a grid structure.

In an exemplary embodiment, the driving circuit layer further includes a switching transistor and a storage capacitor, the driving transistor and the switching transistor have a bottom gate structure respectively, and the light-emitting structure layer has a top emission structure.

An embodiment of the present disclosure further provides a display device, including the display substrate described above.

An embodiment of the present disclosure further provides a preparation method for a display substrate, including:

forming a driving circuit layer including a driving transistor, an auxiliary cathode line and a repair electrode on a substrate, wherein the repair electrode is arranged to connect a drain electrode of the driving transistor with the auxiliary cathode line when repairing a defective bright spot; and forming a light-emitting structure layer on the driving circuit layer, wherein an anode of the light-emitting structure layer is connected with a drain electrode of the driving transistor, and a cathode of the light-emitting structure layer is connected with the auxiliary cathode line.

In an exemplary embodiment, in the action of forming the driving circuit layer including the driving transistor, the auxiliary cathode line and the repair electrode on the substrate, the repair electrode is formed in a first structural layer, a drain electrode of the driving transistor and the auxiliary cathode line are formed in a second structural layer, an insulating layer is formed between the first structural layer and the second structural layer, the repair electrode and the drain electrode of the driving transistor have a first overlapping region, and the repair electrode and the auxiliary cathode line have a second overlapping region.

In an exemplary embodiment, the repair electrode is arranged in the same layer as a gate line and formed by the same patterning process, and the auxiliary cathode line and the drain electrode of the driving transistor are arranged in the same layer as a data line and formed by the same patterning process.

In an exemplary embodiment, in the action of forming the driving circuit layer including the driving transistor, the auxiliary cathode line and the repair electrode on the substrate, a via hole is formed in the first overlapping region, and the drain electrode of the driving transistor is connected with the repair electrode through the via hole.

In an exemplary embodiment, in the action of forming the driving circuit layer including the driving transistor, the auxiliary cathode line and the repair electrode on the substrate, a via hole is formed in the second overlapping region, and the auxiliary cathode line is connected with the repair electrode through the via hole.

In an exemplary embodiment, the repair electrode is a repair electrode line, which is parallel to the gate line, repair electrode lines and auxiliary cathode lines form a grid structure.

In an exemplary embodiment, in the action of forming the driving circuit layer including the driving transistor, the auxiliary cathode line and the repair electrode on the substrate, a switching transistor and a storage capacitor are also formed, the driving transistor and the switching transistor have a bottom gate structure respectively. In the action of forming the light-emitting structure layer on the driving circuit layer, the light-emitting structure layer is a top emission structure.

An embodiment of the present disclosure further provides a repair method for a display substrate, wherein the display substrate includes a driving circuit layer and a light-emitting structure layer which are stacked on a substrate, the driving circuit layer includes a driving transistor, an auxiliary cathode line and a repair electrode, an anode of the light-emitting structure layer is connected with a drain electrode of the driving transistor, and a cathode of the light-emitting structure layer is connected with the auxiliary cathode line; when repairing a defective bright spot, the repair method includes:

connecting the drain electrode of the driving transistor with the auxiliary cathode line by using the repair electrode.

In an exemplary embodiment, the repair electrode is arranged in a first structural layer, the drain electrode of the driving transistor and the auxiliary cathode line are arranged in a second structural layer, and an insulating layer is arranged between the first structural layer and the second structural layer. The repair electrode and the drain electrode of the driving transistor have a first overlapping region, and the repair electrode and the auxiliary cathode line have a second overlapping region. The action of connecting the drain electrode of the driving transistor with the auxiliary cathode line by using the repair electrode includes:

irradiating the first overlapping region and the second overlapping region with laser from a side of the substrate far away from the driving circuit layer, welding and connecting the repair electrode with the drain electrode of the driving transistor, and welding and connecting the repair electrode with the auxiliary cathode line.

In an exemplary embodiment, the repair electrode is arranged in a first structural layer, the drain electrode of the driving transistor and the auxiliary cathode line are arranged in a second structural layer, an insulating layer is arranged between the first structural layer and the second structural layer, the repair electrode is connected with the drain electrode of the driving transistor through a via hole, and the repair electrode and the auxiliary cathode line have a second overlapping region. The action of connecting the drain electrode of the driving transistor with the auxiliary cathode line by using the repair electrode includes:

irradiating the second overlapping region with laser from a side of the substrate far away from the driving circuit layer, and welding and connecting the repair electrode with the auxiliary cathode line.

In an exemplary embodiment, the repair electrode is arranged in a first structural layer, the drain electrode of the driving transistor and the auxiliary cathode line are arranged in a second structural layer, an insulating layer is arranged between the first structural layer and the second structural layer, the repair electrode and the drain electrode of the driving transistor have a first overlapping region, the repair electrode is connected with the auxiliary cathode line through a via hole. The action of connecting the drain electrode of the driving transistor with the auxiliary cathode line by using the repair electrode includes:

irradiating the first overlapping region with laser from a side of the substrate far away from the driving circuit layer, and welding and connecting the repair electrode with the drain electrode of the driving transistor.

In an exemplary embodiment, a power of laser irradiation is 50 mW to 100 mW. Of course, an implementation of any product or method in the embodiments of the present disclosure does not need to achieve all the advantages mentioned above at the same time. Other features and advantages of the present disclosure will be set forth in the following embodiments of the description, and in part will become apparent from the embodiments of the description, or be learned by practice of the present disclosure. Purposes and other advantages of the technical solutions of the present disclosure may be achieved and acquired by structures specified in the detailed description, claims and drawings.

Other aspects will become apparent upon reading and understanding accompanying drawings and the detailed description.

BRIEF DESCRIPTION OF DRAWINGS

The attached drawings are used to provide a further understanding of the technical solution of the present disclosure, and constitute a part of the specification. They are used together with the embodiments of the present application to explain the technical solution of the present disclosure, and do not constitute a restriction on the technical solution of the present disclosure. Shapes and sizes of the components in the drawings do not reflect true proportions and only to be used to schematically illustrate contents of the present disclosure.

DETAILED DESCRIPTION

The following embodiments serve to illustrate the present disclosure, but are not intended to limit the scope of the present disclosure. It should be noted that embodiments in the present disclosure and features in the embodiments may be combined with each other arbitrarily if there is no conflict.

Figure 1:
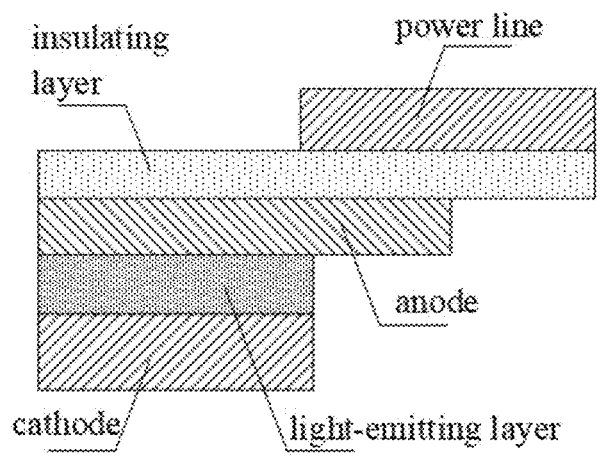
FIG. 1 is a schematic structural diagram of part film layers of an OLED.
Figure 2:
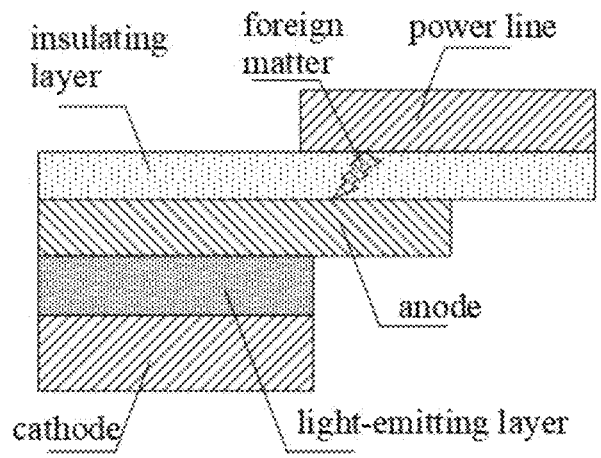
FIG. 2 is a schematic diagram showing the incorporation of foreign matter in a film layer shown in FIG. 1.
Figure 3:
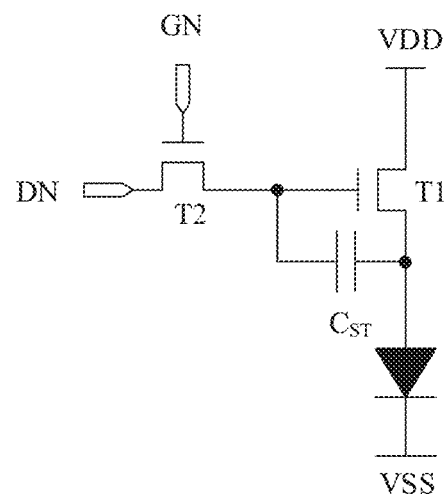
FIG. 3 is a schematic diagram showing an equivalent circuit of a pixel driving circuit of an OLED.
Figure 4:
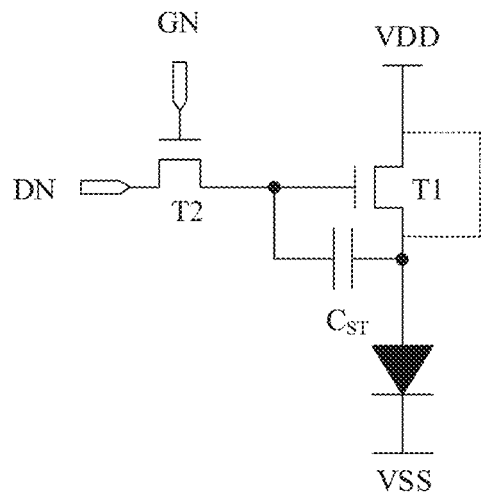
FIG. 4 is a schematic diagram showing that the circuit shown in FIG. 3 has a defective bright spot.

In the production process of an OLED display substrate, the reason for generation of a bright spot is usually that foreign matter conducts the anode of the light-emitting structure and the high potential power line VDD, which makes the pixel continuously emit light, resulting a bright spot. FIG. 1 is a schematic structural diagram of part film layers of an OLED, and FIG. 2 is a schematic diagram showing the incorporation of foreign matter in a film layer shown in FIG. 1. As shown in FIGS. 1 and 2, part of the film layers include a cathode, an anode and a high potential power line VDD, a light-emitting layer is arranged between the cathode and the anode, and the insulating layer is arranged between the anode and the high potential power line VDD. When foreign matter is doped in the insulating layer, the foreign matter will contact both of the high potential power line VDD and the anode, and thus conduct the high potential power line VDD layer and the anode, resulting in a defective bright spot. FIG. 3 is a schematic diagram showing an equivalent circuit of a pixel driving circuit of an OLED, and FIG. 4 is a schematic diagram showing that the circuit shown in FIG. 3 has a defective bright spot, taking 2T1C as an example. As shown in FIGS. 3 and 4, a pixel driving circuit is connected with a switch scanning line GN, a data line DN, a high potential power line VDD and a low potential power line VSS, and includes a first transistor T1, a second transistor T2 and a storage capacitor CsT. The first transistor T1 is a driving transistor, and the second transistor T2 is a switching transistor. The light-emitting layer is equivalent to a light-emitting diode, the anode of which is connected with a drain electrode of the first transistor T1, and the cathode of which is connected with the low potential power line VSS. When the voltage between the anode and the cathode is greater than the turn-on voltage of the light-emitting diode, the light-emitting layer emits light. Under normal circumstances, the high potential power line VDD is 24V, and the opening degrees of the first transistor T1 are different, so the light-emitting intensities of the light-emitting layer are different. When the foreign matter conducts the high potential power line VDD and the anode, as shown by the dotted line in FIG. 4, the anode voltage is constant at 24V. Since the low potential power line VSS is constant at 0V, the voltage at both ends of the light-emitting layer is constant at 24V, the light-emitting layer continues to emit light, and the pixel appears as a bright spot. Obviously, the display substrate with a defective bright spot needs to be repaired to a dark spot before leaving the factory, otherwise it can only be discarded.

Figure 5:
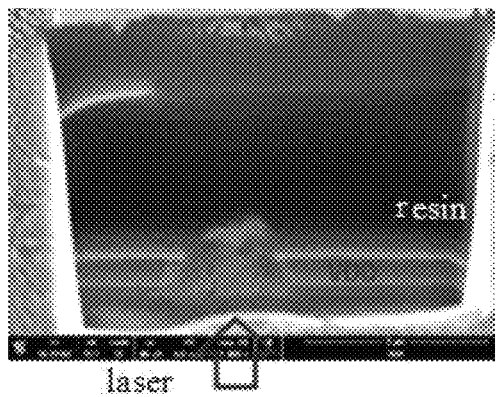
FIG. 5 is a diagram showing a focused ion beam (FIB) at the position where VDD line is cut off.
Figure 6:
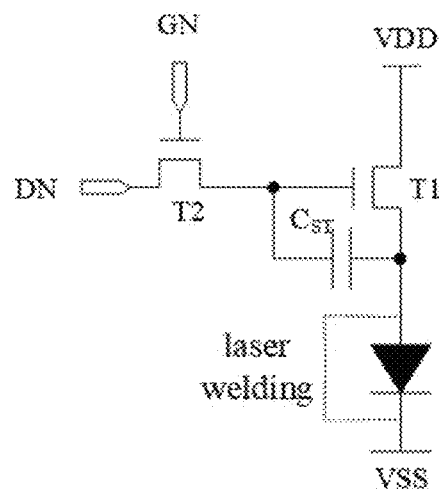
FIG. 6 is a schematic diagram of welding a light-emitting region.

At present, the repair methods of bright spots usually adopt the way of cutting off power lines and welding light-emitting regions, but the repair success rate of the repair methods in related technologies is low. The way of cutting off power lines is to cut off the VDD line with laser, so as to repair the bright spot into a dark spot. FIG. 5 is a diagram showing a focused ion beam (FIB) at the position where VDD line is cut off. As shown in FIG. 5, in the process of preparing a display substrate, in order to ensure the flatness of the formed film, the resin in some areas is very thick. Due to the existence of the thick resin layer, the metal element at the position where the VDD line is cut off with laser does not disappear, but the content is lower than before, so it is still possible to conduct the VDD lines on both sides, resulting in a low repair success rate, which cannot be applied to actual production. FIG. 6 is a schematic diagram of welding a light-emitting region. As shown in FIG. 6, the way of welding the light-emitting region is to weld the light-emitting region with laser, so that the cathode and anode at both ends of the light-emitting layer are short-circuited or the light-emitting layer is damaged, thereby repairing the bright spot into a dark spot. However, the method of welding the light-emitting region is only applicable to the bottom emission type display substrate, but not to the top emission type display substrate. Since the light-emitting region and the driving circuit region of the bottom emission type display substrate are located at different positions, the driving circuit will not be affected when the cathode and anode of the light-emitting region are welded. The light-emitting region of the top emission type display substrate overlaps with the driving circuit. If the cathode and anode are welded on one side of the driving circuit, there is no space for laser to pass through due to the blocking of TFT and storage capacitor. If the cathode and anode are welded on the color filter side, because the color filter layer and encapsulation layer are all thick, which requires high laser energy, high energy laser will damage the driving circuit and cause other defects. Moreover, because the transparent cathode film layer is thin, it is very difficult to control the laser energy to melt the transparent cathode to weld to the reflective anode. In addition, if the transparent cathode is cut and isolated on the color filter side, there will also be the problem that the thick color filter layer and encapsulation layer require large laser energy, which will cause damage to the driving circuit. Therefore, for the defective bright spot of the top emission type display substrate, the repair success rate of the general method of welding the light-emitting region is very low, and it cannot be applied to actual production. At present, there is not yet a suitable method to repair the defective bright spot of the top emission type display substrate.

An embodiment of the present disclosure provides a display substrate. By pre-arranging a repair electrode on the display substrate, when there is a defective bright spot, the anode and cathode of the light-emitting structure layer are short-circuited by the repair electrode to repair the bright spot into a dark spot. The display substrate in the embodiment of the present disclosure includes a driving circuit layer and a light-emitting structure layer which are stacked on a substrate, the driving circuit layer includes a driving transistor, an auxiliary cathode line and a repair electrode, an anode of the light-emitting structure layer is connected with a drain electrode of the driving transistor, a cathode of the light-emitting structure layer is connected with the auxiliary cathode line, the repair electrode is arranged to connect the drain electrode of the driving transistor with the auxiliary cathode line when repairing a defective bright spot. The repair electrode is arranged in a first structural layer, the drain electrode of the driving transistor and the auxiliary cathode line are arranged in a second structural layer, an insulating layer is arranged between the first structural layer and the second structural layer, the repair electrode and the drain electrode of the driving transistor have a first overlapping region, and the repair electrode and the auxiliary cathode line have a second overlapping region. When a defective bright spot needs to be repaired, the repair electrode is connected with the drain electrode of the driving transistor and the auxiliary cathode line, so that the drain electrode of the driving transistor is connected with the auxiliary cathode line. Since the drain electrode of the driving transistor is connected with the anode of the light-emitting structure layer, and the auxiliary cathode line is connected with the cathode of the light-emitting structure layer, conduction between the drain electrode of the driving transistor and the auxiliary cathode line means that the anode and the cathode of the light-emitting structure layer are short-circuited and the bright spot is repaired into a dark spot.

An embodiment of the present disclosure provides a display substrate. By pre-arranging a repair electrode, which is used to connect the drain electrode of the driving transistor with the auxiliary cathode line when there is a defective bright spot, even if the anode and the cathode of the light-emitting structure layer are short-circuited, the bright spot can be repaired into a dark spot, thereby not only effectively repairing the defective bright spot of the top emission type display substrate, avoiding product scrapping, and improving the product yield, but also having high repair success rate, causing no damage to the pixel driving circuit and other defects. Therefore, it can be used in actual production and has good application prospects.

The display substrate of the embodiment of the present disclosure may be implemented in various ways, and the technical solution of the embodiment of the present disclosure will be explained in detail by the embodiments below.

Figure 7:
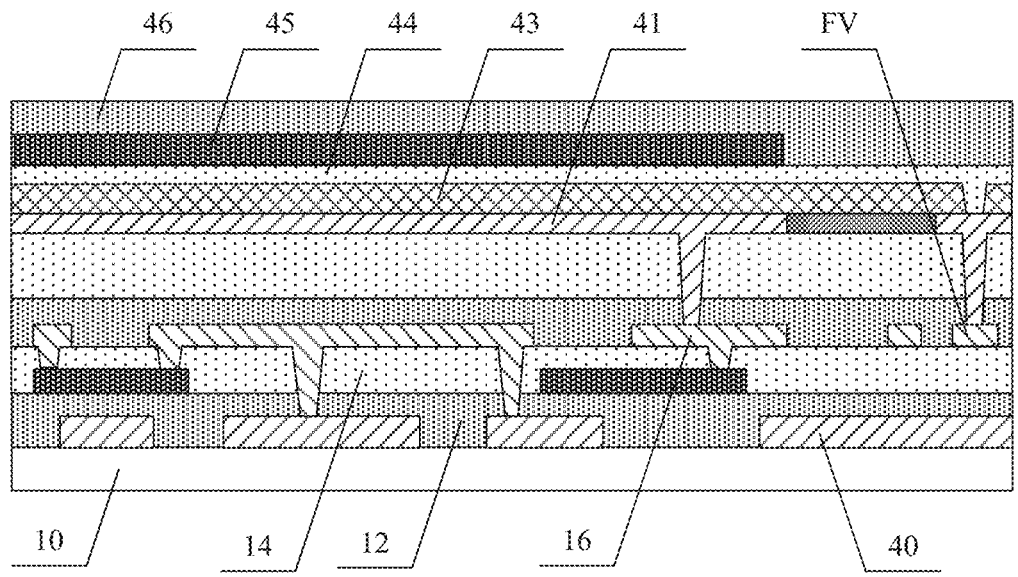
FIG. 7 is a schematic structural diagram of a display substrate according to an embodiment of the present disclosure.

FIG. 7 is a schematic structural diagram of a first embodiment of a display substrate according to the present disclosure. As shown in FIG. 7 in combination with FIGS. 8 to 21, the display substrate of this embodiment includes: a substrate 10; a gate line GN, a first gate electrode 11, a second gate electrode 21, a first capacitor electrode 31 and a repair electrode 40 arranged on the substrate 10; a first insulating layer 12 covering the gate line GN, the first gate electrode 11, the second gate electrode 21, the first capacitor electrode 31 and the repair electrode 40; a first active layer 13, a second active layer 23 and a second capacitor electrode 32 arranged on the first insulating layer 12; a second insulating layer 14 covering the first active layer 13, the second active layer 23 and the second capacitor electrode 32, wherein the second insulating layer 14 is provided with a plurality of via holes including a first via hole V1 and a second via hole V2 respectively exposing the first active layer 13, a third via hole V3 exposing the first gate electrode 11, a fourth via hole V4 exposing the first capacitor electrode 31, and a fifth via hole V5 and a sixth via hole V6 respectively exposing the second active layer 23;

a data line DN, a power line VDD, an auxiliary cathode line FV, a first source electrode 15, a first drain electrode 16, a second source electrode 25 and a second drain electrode 26 arranged on the second insulating layer 14, wherein the first source electrode 15 is connected with the power line VDD and the first active layer 13 through the first via hole V1, and the first drain electrode 16 is connected with the first active layer 13 through the second via hole V2; the second source electrode 25 is connected with the data line DN and the second active layer 23 through the sixth via hole V6, the second drain electrode 26 is connected with the second active layer 23 through the fifth via hole V5, the first gate electrode 11 through the third via hole V3 and the first capacitor electrode 31 through the fourth via hole V4; and the first drain electrode 16 and the repair electrode 40 have a first overlapping region, and the auxiliary cathode line FV and the repair electrode 40 have a second overlapping region;

a third insulating layer 17 covering the data line DN, the power line VDD, the auxiliary cathode line FV, the first source electrode 15, the first drain electrode 16, the second source electrode 25 and the second drain electrode 26, and a fourth insulating layer 18 arranged on the third insulating layer 17, on the fourth insulating layer 18, a seventh via hole V7 exposing the first drain electrode 16 and an eighth via hole V8 exposing the auxiliary cathode line FV are provided;

a reflective anode 41 and a connecting electrode 42 arranged on the fourth insulating layer 18, wherein the reflective anode 41 is connected with the first drain electrode 16 through the seventh via hole V7, and the connecting electrode 42 is connected with the auxiliary cathode line FV through the eighth via hole V8; and a light-emitting layer 43 and a transparent cathode 44 arranged on the reflective anode 41, wherein the transparent cathode 44 is connected with the connecting electrode 42 through a ninth via hole.

Optionally, the display substrate may further include: a color filter layer 45 arranged on the transparent cathode 44; and an encapsulation layer 46 covering the color filter layer 45.

In this embodiment, the repair electrode 40 is arranged on the same layer as the gate line, and is formed of the same material and by the same patterning process as the gate line, as the first structural layer. The first drain electrode 16 and the auxiliary cathode line FV are arranged on the same layer as the data line and formed of the same material and by the same patterning process, as the second structural layer. The first insulating layer 12 and the second insulating layer 14 serve as an insulating layer between the first and second structural layers. The repair electrode 40 has a first overlapping region with the first drain electrode 16, and a second overlapping region with the auxiliary cathode line FV. The repair electrode 40 is used to connect the first drain electrode 16 with the auxiliary cathode line FV when repairing a defective bright spot, thus effectively repairing the defective bright spot of the top emission type display substrate with high repair success rate.

The technical solution of this embodiment is described below by a preparation process of the display substrate. The "patterning process" mentioned in this embodiment includes the treatments, such as film layer deposition, photoresist coating, mask exposure, development, etching, and photoresist stripping. The "photolithography process" in this embodiment includes coating film layer, mask exposure and development. Processes such as a sputtering, an evaporation, a chemical vapor deposition may be used for deposition, which will not be limited herein. In the description of this embodiment, it should be understood that "thin film" refers to a layer of thin film fabricated by a certain material on a substrate by using a deposition or coating process. If a patterning process or a photolithography process is not needed for the "thin film" during the whole forming process, the "thin film" may be referred to as a "layer". If a patterning process or a photolithography process is needed for the "thin film" during the whole forming process, it is referred to as "thin film" before the patterning process, and referred to as "layer" after the patterning process. The "layer" after the patterning process or photolithography process includes at least one "pattern".

Figure 8:
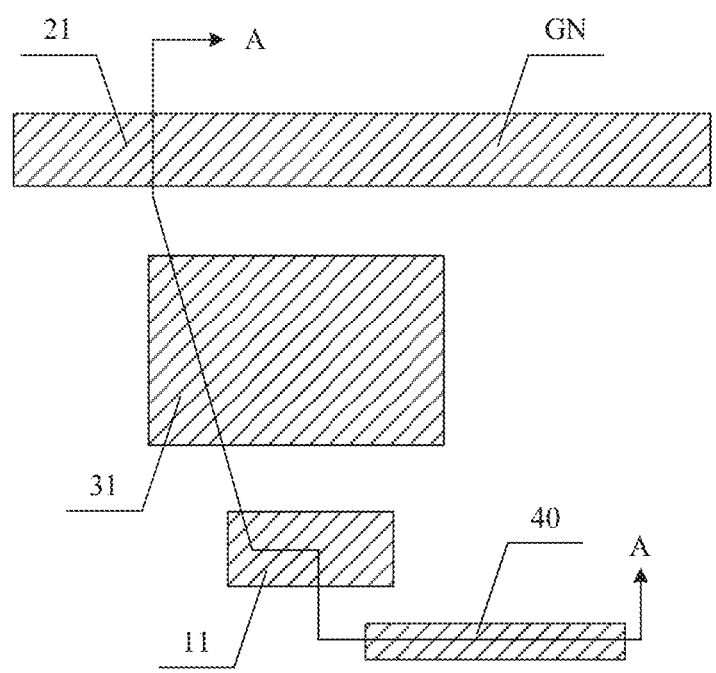
FIG. 8 is a schematic diagram after formation of a pattern of a gate line and a repair electrode according to an embodiment of the present disclosure.
Figure 9:
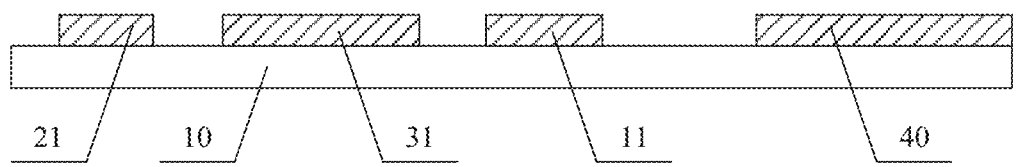
FIG. 9 is a sectional view taken along an A-A direction in FIG. 8.

(1) Forming a pattern of a gate line, a gate electrode, a first capacitor electrode and a repair electrode on a substrate. Forming the pattern of the gate line, the gate electrode, the first capacitor electrode and the repair electrode includes: depositing a first metal film on the first substrate 10, coating a layer of photoresist on the first metal film, exposing and developing the photoresist with a single tone mask, forming an unexposed area and retaining the photoresist at a position of the pattern of the gate line, the gate electrode, the first capacitor electrode and the repair electrode, forming a fully exposed area and removing the photoresist at other positions, etching the first metal film of the fully exposed area and stripping the remaining photoresist to form a pattern of the gate line GN, the first gate electrode 11, the second gate electrode 21, the first capacitor electrode 31 and the repair electrode 40 on the substrate 10, as shown in FIGS. 8 and 9. FIG. 9 is a sectional view taken along an A-A direction in FIG. 8. The first capacitor electrode 31 serves as a lower electrode plate for forming a storage capacitor, and the second gate electrode 21 is an integrated structure connected with the gate line GN. The first metal film may be made of a metal material, such as argentum (Ag), copper (Cu), aluminum (Al), molybdenum (Mo), or an alloy material of the above metals, such as aluminum neodymium alloy (AlNd), molybdenum niobium alloy (MoNb), or may be a multi-layer metal structure, such as molybdenum (Mo)/ copper (Cu)/ molybdenum (Mo), or may be a stacked structure formed by a metal and a transparent conductive material, such as indium tin oxide (ITO)/argentum (Ag)/ indium tin oxide (ITO).

Figure 10:
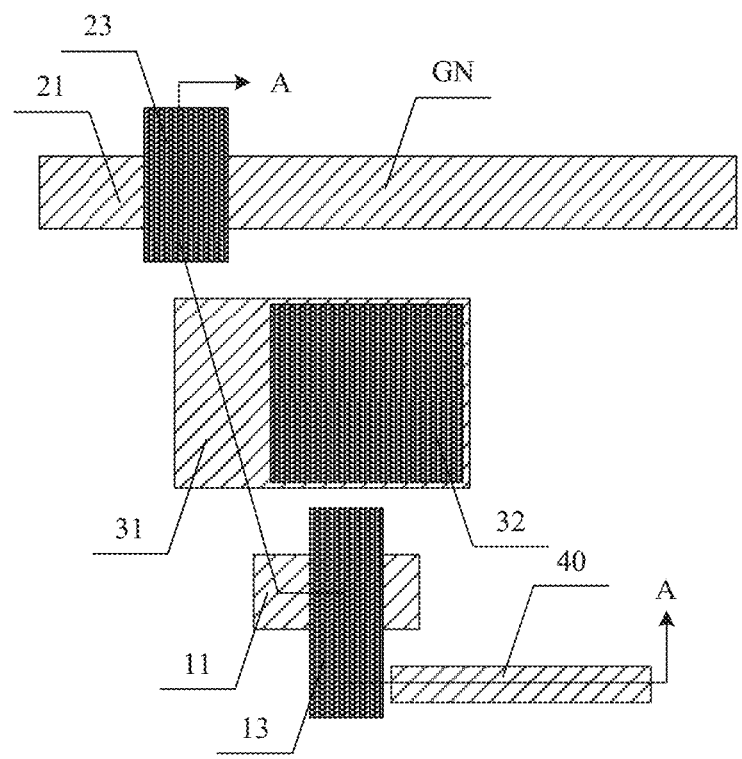
FIG. 10 is a schematic diagram after formation of a pattern of an active layer according to an embodiment of the present disclosure.
Figure 11:
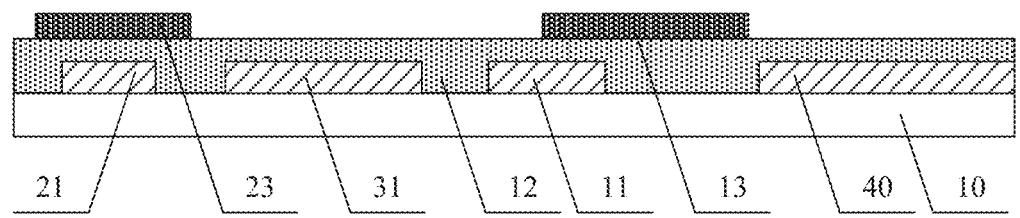
FIG. 11 is a sectional view taken along an A-A direction in FIG. 10.

(2) Forming a pattern of an active layer. Forming the pattern of the active layer includes: depositing a first insulating film and an active layer film in sequence on the substrate on which the aforementioned pattern has been formed, patterning the active layer film by a patterning process to form a pattern of the first insulating layer 12 covering the gate line GN, the first gate electrode 11, the second gate electrode 21, the first capacitor electrode 31 and the repair electrode 40, and a pattern of the first active layer 13, the second active layer 23 and the second capacitor electrode 32 arranged on the first insulating layer 12, as shown in FIGS. 10 and 11. FIG. 11 is a sectional view taken along an A-A direction in FIG. 10. The second capacitor electrode 32 serves as an upper electrode plate for forming a storage capacitor. The active layer film may be made of any one of materials such as amorphous indium gallium zinc Oxide (a-IGZO), zinc oxynitride (ZnON), indium zinc tin oxide (IZTO), amorphous silicon (a-Si), polysilicon (p-Si), sexithiophene, polythiophene, that is, this embodiment is applicable to a bottom Gate TFT-based display substrate manufactured through an oxide technology, a silicon technology and an organic technology. The process of forming the pattern of the active layer includes conducting the second capacitor electrode 32. The first insulating film may be made of silicon oxide (SiOx), silicon nitride (SiNx) and silicon oxynitride (SiON), or may be made of a high k material such as aluminum oxide (AlOx), hafnium oxide (HfOx), tantalum oxide (TaOx), or the like, and may be of a single layer, multiple layers, or a composite layer. Generally, the first insulating layer 12 is referred to as a gate insulating (GI) layer.

Figure 12:
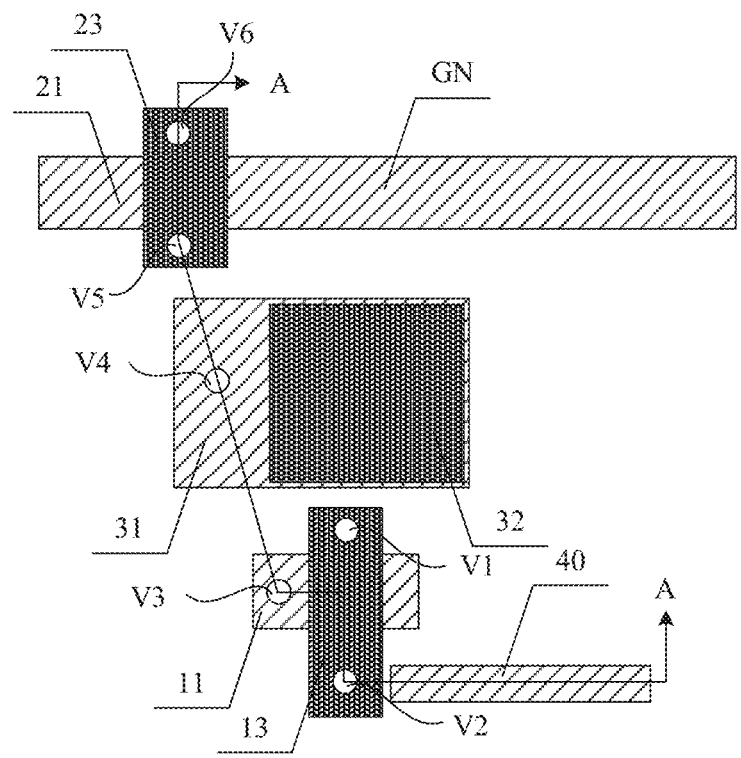
FIG. 12 is a schematic view after formation of a pattern of a second insulating layer according to an embodiment of the present disclosure.
Figure 13:
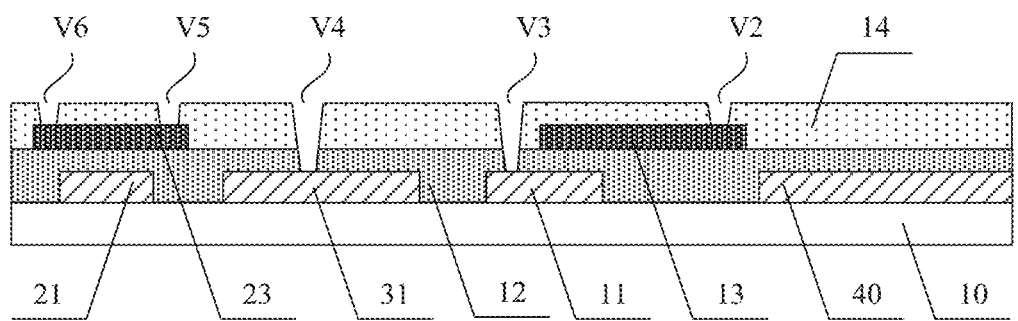
FIG. 13 is a sectional view taken along an A-A direction in FIG. 12.

(3) Forming a pattern of a second insulating layer. Forming the pattern of the second insulating layer includes: depositing a second insulating film on the substrate on which the aforementioned patterns have been formed, patterning the second insulating film by a patterning process to form a pattern of the second insulating layer 14 covering the pattern of the first active layer 13, the second active layer 23 and the second capacitor electrode 32, wherein the second insulating layer 14 is provided with a plurality of via holes, including a first via hole V1 and a second via hole V2 respectively exposing both ends of the first active layer 13, a third via hole V3 exposing the first gate electrode 11, a fourth via hole V4 exposing the first capacitor electrode 31, and a fifth via hole V5 and a sixth via hole V6 exposing both ends of the second active layer 23, as shown in FIGS. 12 and 13. FIG. 13 is a sectional view taken along an A-A direction in FIG. 12. The second insulating layer 14 in the first via hole V1 and the second via hole V2 is etched to expose a surface of the first active layer 13, the second insulating layer 14 in the fifth via hole V5 and the sixth via hole V6 are etched to expose a surface of the second active layer 23, the second insulating layer 14 and the first insulating layer 12 in the third via hole V3 are etched to expose a surface of the first gate electrode 11, and second insulating layer 14 and the first insulating layer 12 in the fourth via hole V4 are etched to expose a surface of the first capacitor electrode 31. The second insulating film may be made of silicon oxide (SiOx), silicon nitride (SiNx) and silicon oxynitride (SiON), or may be made of a high k material such as aluminum oxide (AlOx), hafnium oxide (HfOx), tantalum oxide (TaOx), or the like, and may be of a single layer, multiple layers, or a composite layer. Generally, the second insulating layer 14 is referred to as an interlayer insulating (ILD) layer.

Figure 14:
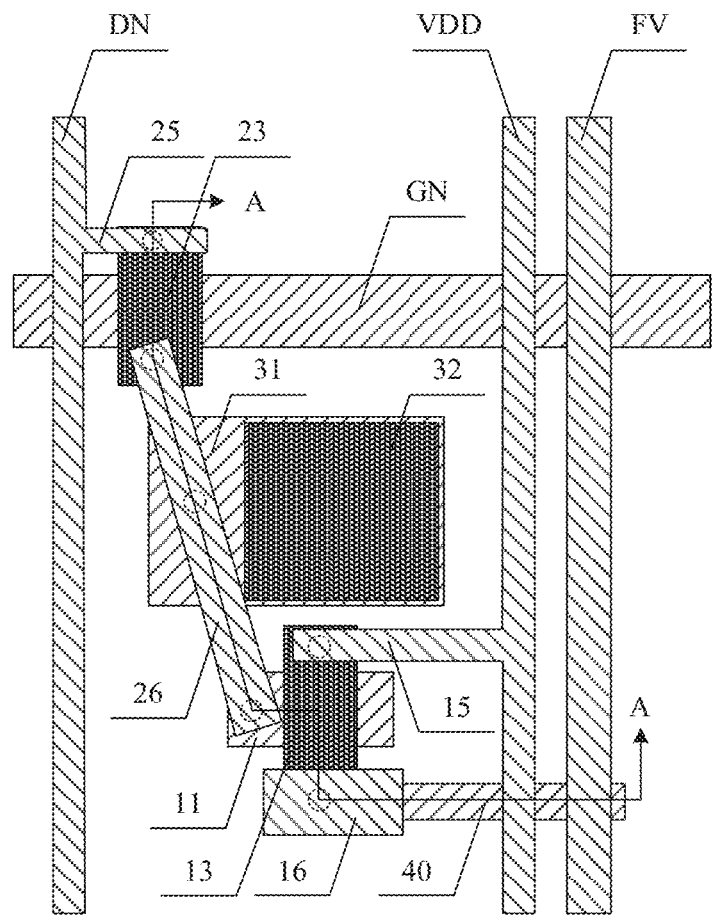
FIG. 14 is a schematic diagram after formation of a pattern of a data line and an auxiliary cathode line according to an embodiment of the present disclosure.
Figure 15:
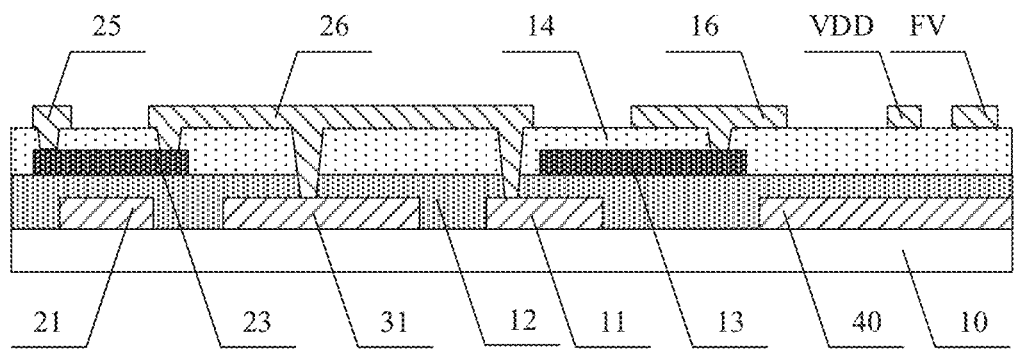
FIG. 15 is a sectional view taken along an A-A direction in FIG. 14.

(4) Forming a pattern of a data line, a power line, an auxiliary cathode line and source and drain electrodes. Forming the pattern of the data line, the power line, the auxiliary cathode line and the source and drain electrodes includes: depositing a second metal film on the substrate on which the aforementioned patterns have been formed, patterning the second metal film by a patterning process to form a pattern of the data line DN, the power line VDD, the auxiliary cathode lines FV, the first source electrode 15, the first drain electrode 16, the second source electrode 25 and the second drain electrode 26 on the second insulating layer 14, as shown in FIGS. 14 and 15. FIG. 15 is a sectional view taken along an A-A direction in FIG. 14. The data line DN is perpendicular to the gate line GN and located at one side of the pixel, the power line VDD and the auxiliary cathode line FV are parallel to the data line DN and located at the other side of the pixel, the first source electrode 15 is an integrated structure connected with the power line VDD and connected with one end of the first active layer 13 through the first via hole V1, the first drain electrode 16 is connected with the other end of the first active layer 13 through the second via hole V2, the second source electrode 25 is an integrated structure connected with the data line DN and connected with one end of the second active layer 23 through the sixth via hole V6, one end of the second drain electrode 26 is connected with the other end of the second active layer 23 through the fifth via hole V5, the other end of the second drain electrode 26 is connected with the first gate electrode 11 through the third via hole V3, and a middle portion of the second drain electrode 26 is connected with the first capacitor electrode 31 through the fourth via hole V4. The first drain electrode 16 and the repair electrode 40 have a first overlapping region, and the auxiliary cathode line FV and the repair electrode 40 have a second overlapping region, that is, an orthographic projection of the first drain electrode 16 on the substrate overlaps with an orthographic projection of the repair electrode 40 on the substrate, and an orthographic projection of the auxiliary cathode line FV on the substrate overlaps with an orthographic projection of the repair electrode 40 on the substrate. The second metal film may be made of a metal material, such as argentum (Ag), copper (Cu), aluminum (Al), molybdenum (Mo), or an alloy material of the above metals, such as aluminum neodymium alloy (AlNd), molybdenum niobium alloy (MoNb), or may be a multi-layer metal structure, such as molybdenum (Mo)/copper (Cu)/molybdenum (Mo), or may be a stacked structure formed by a metal and a transparent conductive material, such as indium tin oxide (ITO)/argentum (Ag)/indium tin oxide (ITO).

Figure 16:
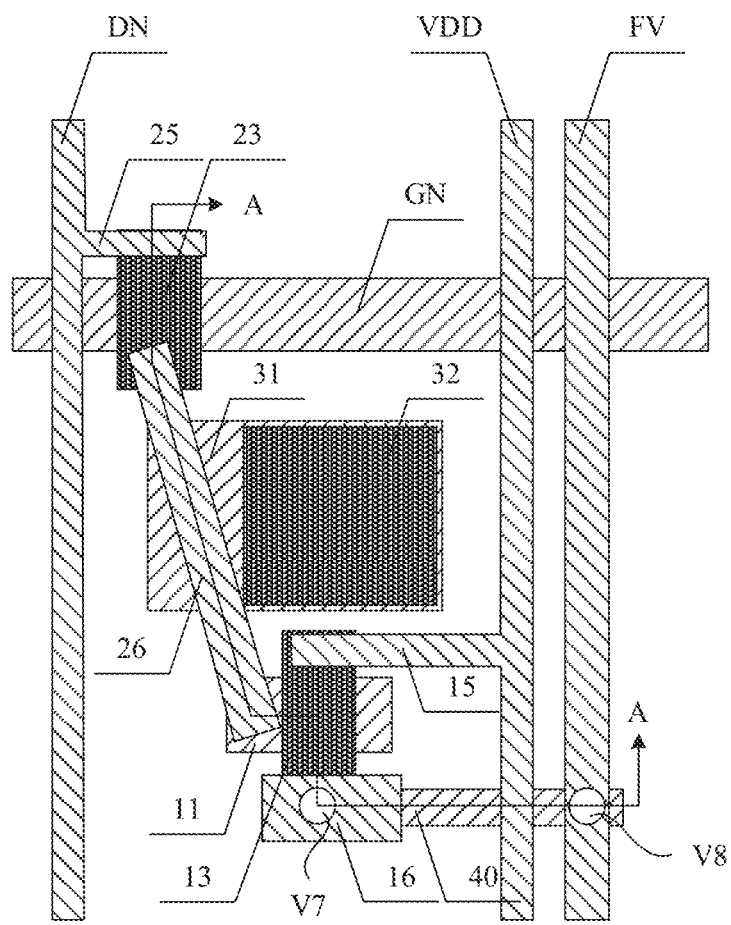
FIG. 16 is a schematic diagram after formation of a pattern of a third insulating layer and a fourth insulating layer according to an embodiment of the present disclosure.
Figure 17:
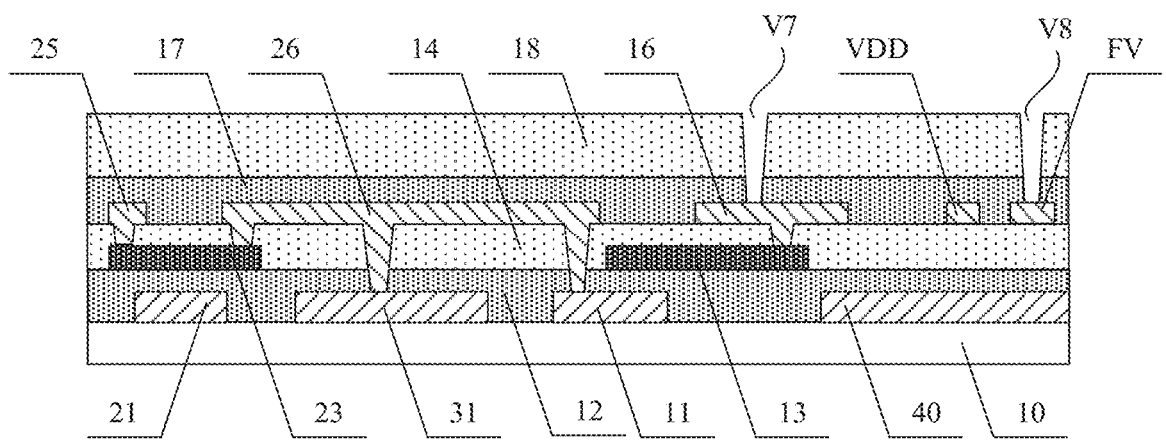
FIG. 17 is a sectional view taken along an A-A direction in FIG. 16.

(5) Forming a pattern of a third insulating layer and a fourth insulating layer. Forming the pattern of the third insulating layer and the fourth insulating layer includes: first depositing a third insulating film on the substrate on which the aforementioned patterns have been formed, then coating a fourth insulating film, patterning the third insulating film by a patterning process with the fourth insulating film as photoresist to form a pattern of the third insulating layer 17 covering the pattern of the data line, the power line, the auxiliary cathode line and the source and drain electrodes, and to form a pattern of the fourth insulating layer 18 covering the pattern of the third insulating layer 17, wherein the third insulating layer 17 and the fourth insulating layer 18 are provided with a seventh via hole V7 and an eighth via hole V8, the third insulating layer 17 and the fourth insulating layer 18 in the seventh via hole V7 are etched to expose a surface of the first drain electrode 16, the third insulating layer 17 and the fourth insulating layer 18 in the eighth via hole V8 are etched to expose a surface of the auxiliary cathode line FV, as shown in FIGS. 16 and 17. FIG. 17 is a sectional view taken along an A-A direction in FIG. 16. The third insulating film may be made of silicon oxide (SiOx), silicon nitride (SiNx) and silicon oxynitride (SiON), or may be made of a high k material such as aluminum oxide (AlOx), hafnium oxide (HfOx), tantalum oxide (TaOx), or the like, and may be of a single layer, multiple layers, or a composite layer. The fourth insulating film may be made of an organic material. Generally, the third insulating layer 17 is referred to as a passivation (PVX) layer, and the fourth insulating layer 18 is referred to as a planarization (PNL) layer.

Figure 18:
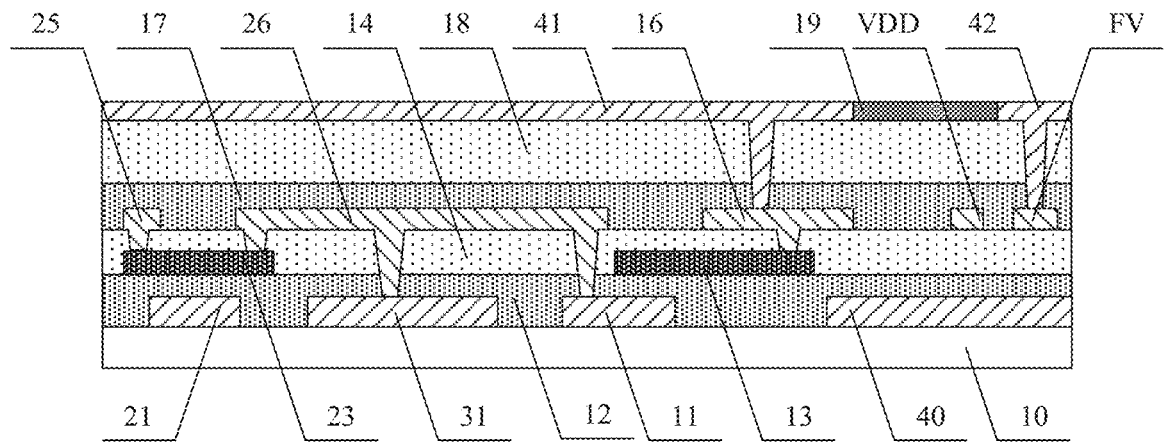
FIG. 18 is a schematic diagram after formation of a pattern of a reflective anode and a connecting electrode according to an embodiment of the present disclosure.

(6) Forming a pattern of a pixel define layer, a reflective anode and a connecting electrode. Forming the pixel define layer and the reflective anode includes: first coating a pixel defining film on the substrate on which the aforementioned patterns have been formed, and forming a pattern of the pixel define layer 19 on the fourth insulating layer 18 through masking, exposure and development; then depositing a third metal film, and patterning the third metal film by a patterning process to form a pattern of the reflective anode 41 and the connecting electrode 42, wherein the reflective anode 41 is connected with the first drain electrode 16 through the seventh via hole V7, and the connecting electrode 42 is connected with the auxiliary cathode line FV through the eighth via hole V8, as shown in FIG. 18. Another connecting electrode may also be formed on the fourth insulating layer 18, which is connected with the first drain electrode 16 and the second capacitor electrode 32 through a via hole. There are many ways to connect the first drain electrode 16 with the second capacitor electrode 32, which will not be repeated here.

Figure 19:
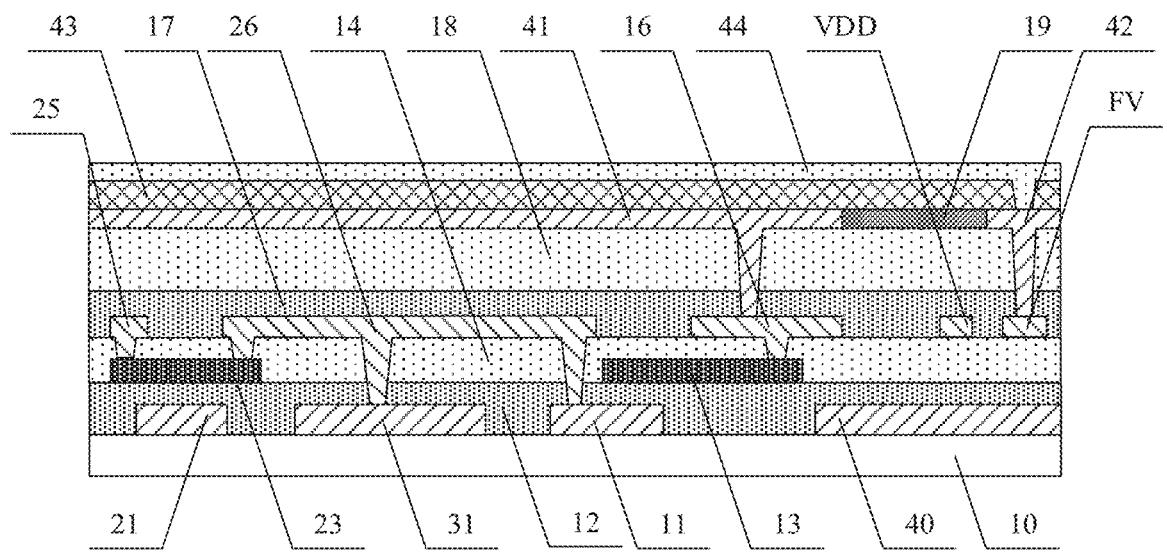
FIG. 19 is a schematic diagram after formation of a pattern of a light-emitting layer and a transparent cathode according to an embodiment of the present disclosure.

(7) Forming a pattern of a light-emitting layer and a transparent cathode. Forming the pattern of the light-emitting layer and the transparent cathode includes: forming a light-emitting layer 43 by evaporation on the substrate on which the aforementioned patterns have been formed, wherein the light-emitting layer 43 is provided with a ninth via hole at the position of the connecting electrode 42; and then depositing a transparent conductive film to form the transparent cathode 44 on the light-emitting layer 43, wherein the transparent cathode 44 is connected with the connecting electrode 42 through the ninth via hole, as shown in FIG. 19. Top emission type OLED adopts transparent cathode, which is usually a thin magnesium (Mg)/silver (Ag) alloy. Because the transparent cathode is thin and the IR Drop is serious, an auxiliary cathode line is arranged to connect with the transparent cathode to reduce the overall resistance of the transparent cathode. In this embodiment, the transparent cathode 44 is connected with the connecting electrode 42 through the ninth via hole, and since the connecting electrode 42 is connected with the auxiliary cathode line FV through the eighth via hole, the transparent cathode 44 is connected with the auxiliary cathode line FV through the connecting electrode 42.

(8) Forming a pattern of a color filter layer and an encapsulation layer. Forming the pattern of the color filter layer and the encapsulation layer includes: on the substrate on which the aforementioned patterns have been formed, first forming a pattern of the color filter layer 45 by coating, and then forming a pattern of the encapsulation layer 46 by deposition or coating, as shown in FIG. 7. The structure of the color filter layer according to this embodiment is suitable for that the light-emitting layers of all sub-pixels emit light of the same color, and each sub-pixel may emit light of the required color by filtering of the color filter layer. In other embodiments, the color filter layer may not be provided, which is suitable for the light-emitting layer emitting light of the required color.

In this way, the preparation of the display substrate of this embodiment is completed. The first gate electrode 11, the first active layer 13, the first source electrode 15 and the first drain electrode 16 form a first transistor as the driving transistor, and the second gate electrode 21, the second active layer 23, the second source electrode 25 and the second drain electrode 26 form a second transistor as the switching transistor. The first source electrode 15 is connected with the power line VDD, the first drain electrode 16 is connected with the reflective anode 41 and the second capacitor electrode 32, respectively, and the first drain electrode 16, the reflective anode 41 and the second capacitor electrode 32 have the same potential. The first gate electrode 11 is connected with the second drain electrode 26. Since the second drain electrode 26 is connected with the first capacitor electrode 31, the first gate electrode 11 is connected with the first capacitor electrode 31. The first gate electrode 11, the second drain electrode 26 and the first capacitor electrode 31 have the same potential, so that the first capacitor electrode 31 and the second capacitor electrode 32 form a storage capacitor.

Figure 20:
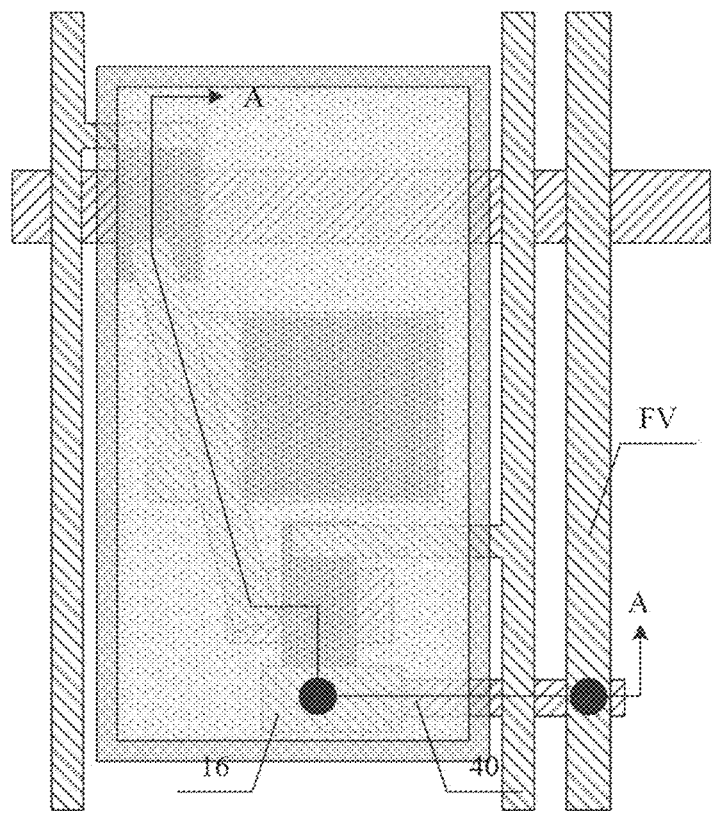
FIG. 20 is a schematic diagram of repairing a defective bright spot according to an embodiment of the present disclosure.
Figure 21:
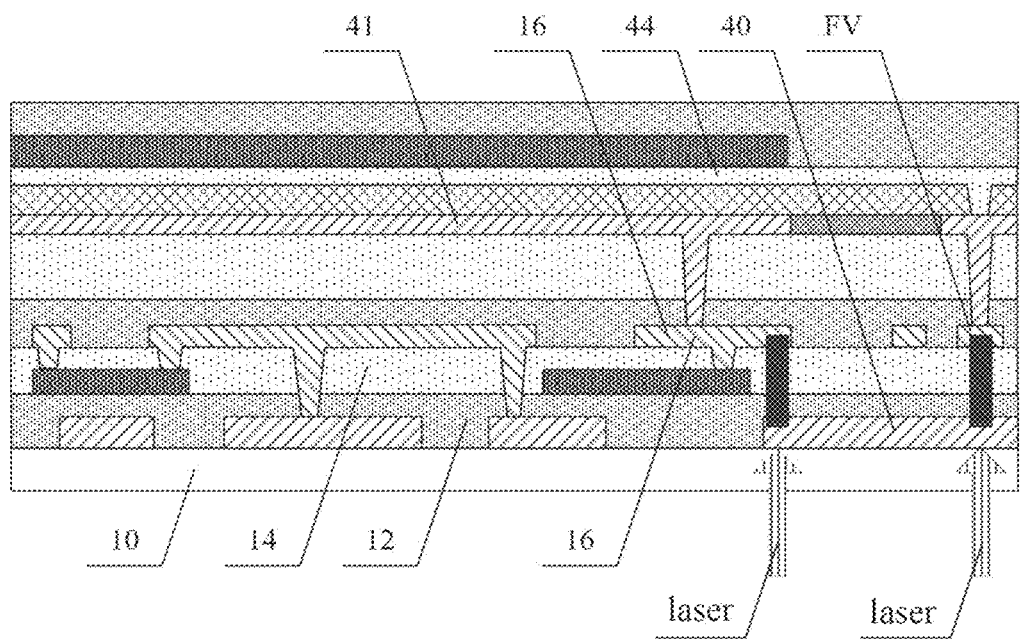
FIG. 21 is a sectional view taken along an A-A direction in FIG. 20.

FIG. 20 is a schematic diagram of repairing a defective bright spot according to an embodiment of the present disclosure, and FIG. 21 is a sectional view taken along an A-A direction in FIG. 20. As shown in FIGS. 20 and 21, the repair electrode 40 is arranged in the same layer as the gate line and formed by the same patterning process. The first drain electrode 16 is arranged in the same layer as the auxiliary cathode line FV and formed by the same patterning process. A first insulating layer 12 and a second insulating layer 14 are provided for spacing between the repair electrode 40 and the first drain electrode 16 and the auxiliary cathode line FV. The repair electrode 40 has a first overlapping region with the first drain electrode 16 and a second overlapping region with the auxiliary cathode line FV. The repair electrode 40 is used to short-circuit the reflective anode 41 and the transparent cathode 44 when repairing a defective bright spot. For example, when a pixel of a display substrate needs to be repaired due to occurrence of a defective bright spot, the first overlapping region and the second overlapping region are irradiated with laser from a side of the substrate 10 far away from the driving circuit layer (lower side in FIG. 20), and the laser irradiation power may be 50 mW to 100 mW. The laser irradiation causes melt of the first insulating layer 12 and the second insulating layer 14 in the overlapping region, connection of the repair electrode 40 with the first drain electrode 16 in the first overlapping region, and connection of the repair electrode 40 with the auxiliary cathode line FV in the second overlapping region, so that the first drain electrode 16 and the auxiliary cathode line FV are interconnected through the repair electrode 40. Since the first drain electrode 16 is connected with the reflective anode 41 and the auxiliary cathode line FV is connected with the transparent cathode 44, conduction between the first drain electrode 16 and the auxiliary cathode line FV means conduction between the reflective anode 41 and the transparent cathode 44, that is, the reflective anode 41 and the transparent cathode 44 are short-circuited, the voltage at both ends of the light-emitting layer is 0, the light-emitting layer does not emit light, and the bright spot is repaired into a dark spot.

According to the structure and preparation process of the display substrate in this embodiment, it can be seen that in this embodiment, a repair electrode is pre-arranged to achieve the short circuit between the reflective anode and the transparent cathode in the pixel, so as to repair the bright spot into a dart spot. In this embodiment, a repair electrode is pre-arranged on the display substrate, the repair electrode has a first overlapping region with the first drain electrode and a second overlapping region with the auxiliary cathode line. When a defective bright spot of a pixel needs to be corrected, laser irradiation is performed on the first overlapping region and the second overlapping region from a side of the substrate far away from the driving circuit layer, the repair electrode is connected with the first drain electrode in the first overlapping region and with the auxiliary cathode line in the second overlapping region, so that the first drain electrode and the auxiliary cathode line are conducted through the repair electrode. Since the first drain electrode is connected with the reflective anode and the auxiliary cathode line is connected with the transparent cathode, the short circuit between the reflective anode and the transparent cathode is achieved, and the pixel becomes a dark spot. This embodiment effectively improves the success rate of the method for repairing a defective bright spot, not only achieves the effective repair of a defective bright spot of the top emission type display substrate, avoids product scrapping, and improves the product yield rate, but also causes no damage to the pixel driving circuit and other defects, and has high repair success rate. Therefore, it can be used in actual production and has good application prospects.

In this embodiment, the repair electrode is arranged on the same layer as the gate line and formed by the same patterning process as the gate line, so there is no need to change process equipment, add new processes and introduce new materials for the preparation process of the display substrate in this embodiment, and it has good process compatibility and high process realizability. Moreover, the arrangement of the repair electrode does not change the layout of TFT and storage capacitor, and has no influence on the product aperture ratio and the product yield before repair. In addition, because in this embodiment the repair electrode is separated from the first drain electrode and the auxiliary cathode line only by the first insulating layer and the second insulating layer which are thinner, the bright spot may be repaired by using the conventional way of laser welding, the welding success rate is high, and the repair success rate may reach 100%. In the actual preparation process, it is almost impossible for foreign matter to cause the repair electrode to interconnect with the first drain electrode and the repair electrode to interconnect with the auxiliary cathode line at the same time. Therefore, the arrangement of the repair electrode will not cause defects and will not affect the product yield.

It should be noted that the process of preparing the display substrate described in this embodiment is only an example. In practice, the display substrate of this embodiment may be prepared in other orders, which is not limited in this embodiment. Although 2T1C is taken as an example in this embodiment, it is not limited to this, and the scheme of this embodiment is also applicable to the structures of display substrates such as 3T1C and 4T1C.

Figure 22:
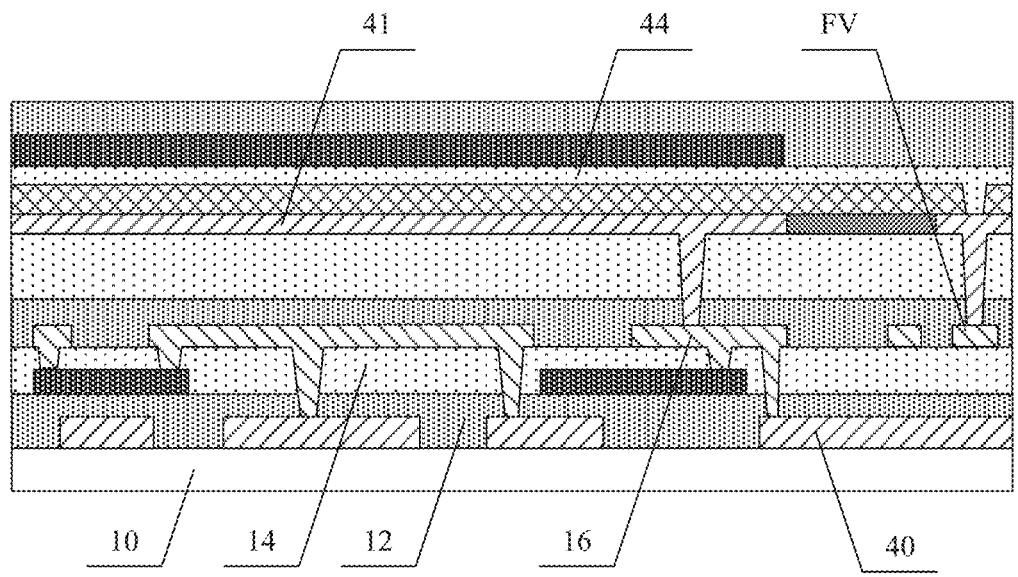
FIG. 22 is a schematic structural diagram of another display substrate according to an embodiment of the present disclosure.

FIG. 22 is a schematic structural diagram of another embodiment of a display substrate of the present disclosure. This embodiment is an extension of the previous embodiment. The main structure of the display substrate of this embodiment is basically the same as that of the previous embodiment. The repair electrode 40 is arranged on the same layer as the gate line, and the first drain electrode 16 is arranged on the same layer as the auxiliary cathode line FV. A first insulating layer 12 and a second insulating layer 14 are provided for spacing between the repair electrode 40 and the first drain electrode 16 and the auxiliary cathode line FV. The repair electrode 40 has a second overlapping region with the auxiliary cathode line FV. As shown in FIG. 22, the difference is that in the structure of the display substrate of this embodiment, the first drain electrode 16 is connected with the repair electrode 40 through a tenth via hole.

Figure 23:
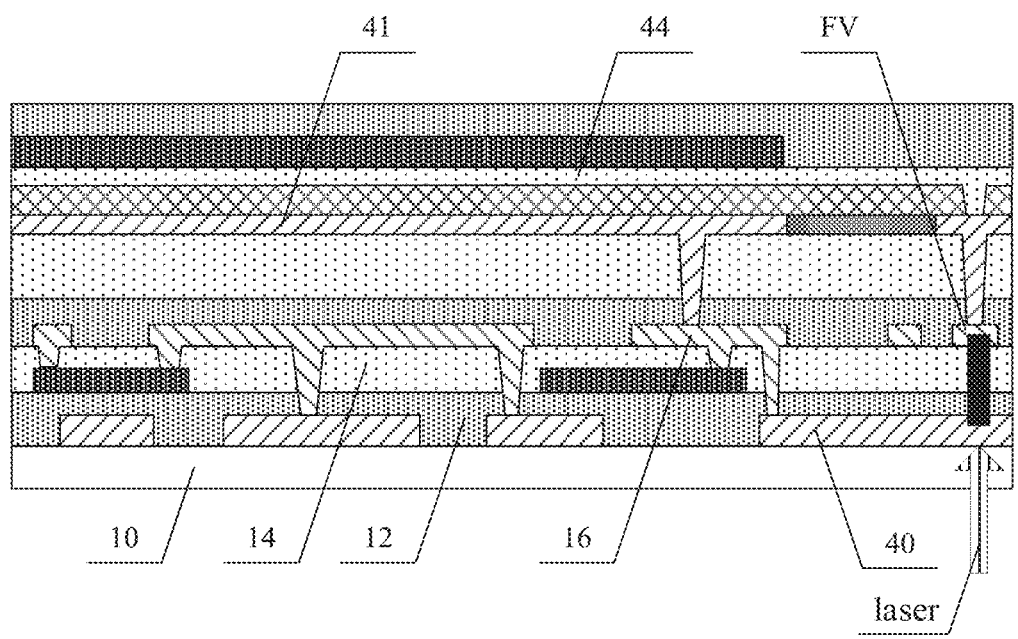
FIG. 23 is a schematic diagram of repairing a defective bright spot for the display substrate shown in FIG. 22.

FIG. 23 is a schematic diagram of repairing a defective bright spot according to this embodiment. As shown in FIG. 23, when a pixel of the display substrate needs to be repaired due to occurrence of a defective bright spot, laser irradiation is performed on the second overlapping region from the side of the substrate 10 far away from the driving circuit layer, so that the repair electrode 40 is connected with the auxiliary cathode line FV in the second overlapping region, and the first drain electrode 16 and the auxiliary cathode line FV are conducted through the repair electrode 40, that is, the reflective anode 41 is short-circuited with the transparent cathode 44, thereby repairing the bright spot into a dark spot.

The preparation process of the display substrate in this embodiment is basically the same as that of the previous embodiment, except that when the second insulating layer 14 is formed in step (3), a tenth via hole exposing the repair electrode 40 is formed, and the second insulating layer 14 and the first insulating layer 12 in the tenth via hole are etched to expose a surface of the repair electrode 40. In this way, the first drain electrode 16 formed in step (4) may be connected with the repair electrode 40 through the tenth via hole.

This embodiment may also effectively repair the defective bright spots of the top emission type display substrate, with high repair success rate, and may simplify the repair process, which only needs laser welding at one position. In addition, the connection between the first drain electrode and the repair electrode will not affect the normal operation of the pixel driving circuit.

Figure 24:
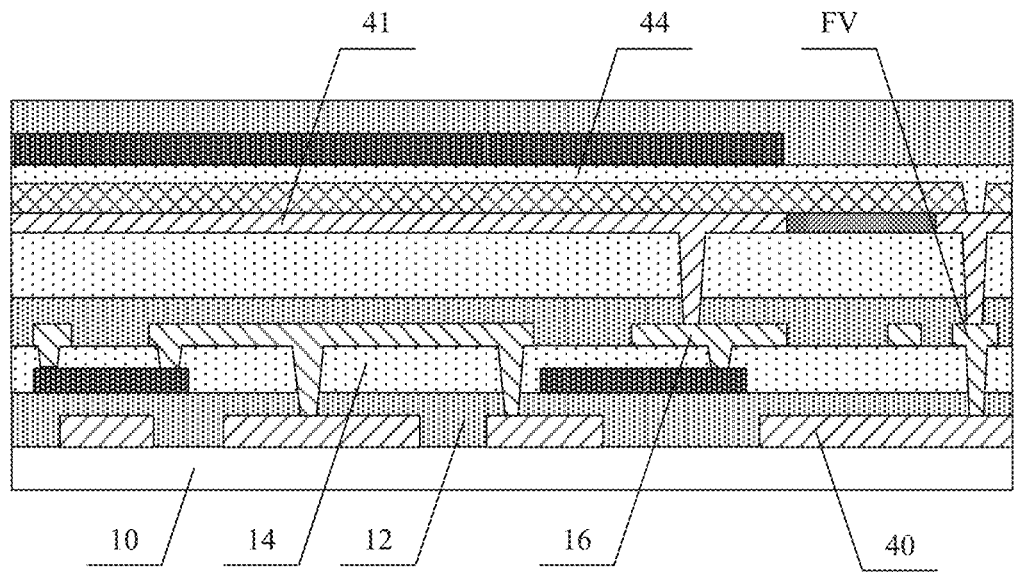
FIG. 24 is a schematic structural diagram of another display substrate according to an embodiment of the present disclosure.

FIG. 24 is a schematic structural diagram of another embodiment of a display substrate according to the present disclosure. This embodiment is an extension of the previous embodiment. The main structure of the display substrate of this embodiment is basically the same as that of the previous embodiment. The repair electrode 40 is arranged on the same layer as the gate line, and the first drain electrode 16 is arranged on the same layer as the auxiliary cathode line FV. A first insulating layer 12 and a second insulating layer 14 are provided for spacing between the repair electrode 40 and the first drain electrode 16 and the auxiliary cathode line FV. The repair electrode 40 has a second overlapping region with the auxiliary cathode line FV. As shown in FIG. 24, the difference is that in the structure of the display substrate of this embodiment, the auxiliary cathode line FV is connected with the repair electrode 40 through an eleventh via hole.

Figure 25:
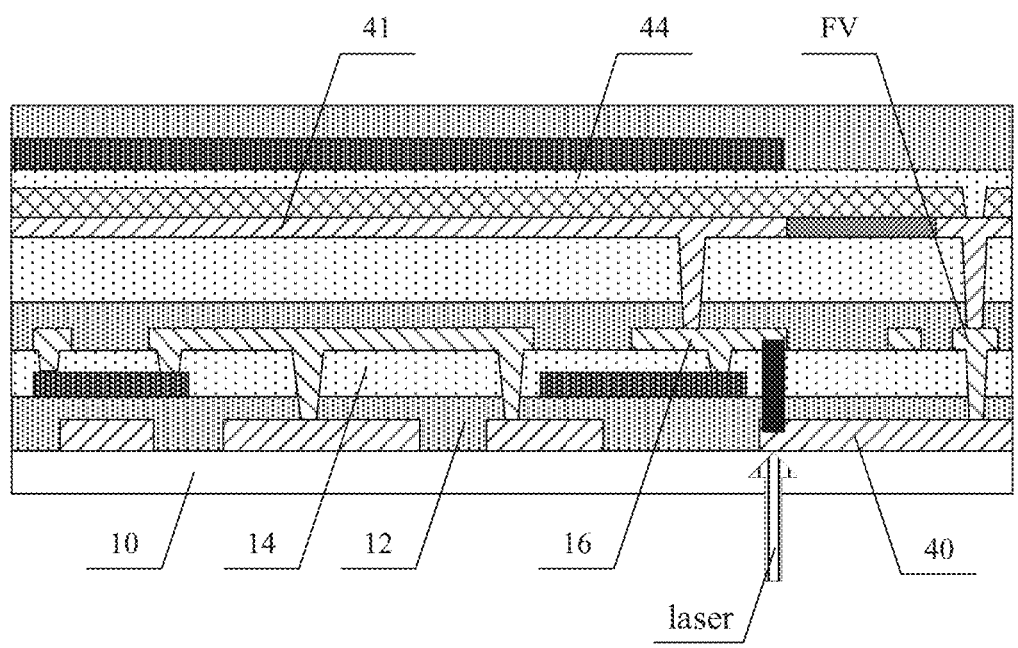
FIG. 25 is a schematic diagram of repairing a defective bright spot for the display substrate shown in FIG. 24.

FIG. 25 is a schematic diagram of repairing a defective bright spot according to this embodiment. As shown in FIG. 25, when a pixel of the display substrate needs to be repaired due to occurrence of a defective bright spot, laser irradiation is performed on the first overlapping region from the side of the substrate 10 far away from the driving circuit layer, so that the repair electrode 40 is connected with the first drain electrode 16 in the first overlapping region, and the first drain electrode 16 and the auxiliary cathode line FV are conducted through the repair electrode 40, that is, the reflective anode 41 is short-circuited with the transparent cathode 44, thereby repairing the bright spot into a dark spot.

The preparation process of the display substrate in this embodiment is basically the same as that of the previous embodiment, except that when the second insulating layer 14 is formed in step (3), an eleventh via hole exposing the repair electrode 40 is formed, and the second insulating layer 14 and the first insulating layer 12 in the eleventh via hole are etched to expose a surface of the repair electrode 40. In this way, the auxiliary cathode line FV formed in step (4) may be connected with the repair electrode 40 through the eleventh via hole.

This embodiment may also effectively repair the defective bright spots of the top emission type display substrate, with high repair success rate, and may simplify the repair process, which only needs laser welding at one position. In addition, the connection between the auxiliary cathode line and the repair electrode will not affect the normal operation of the pixel driving circuit.

Figure 26:
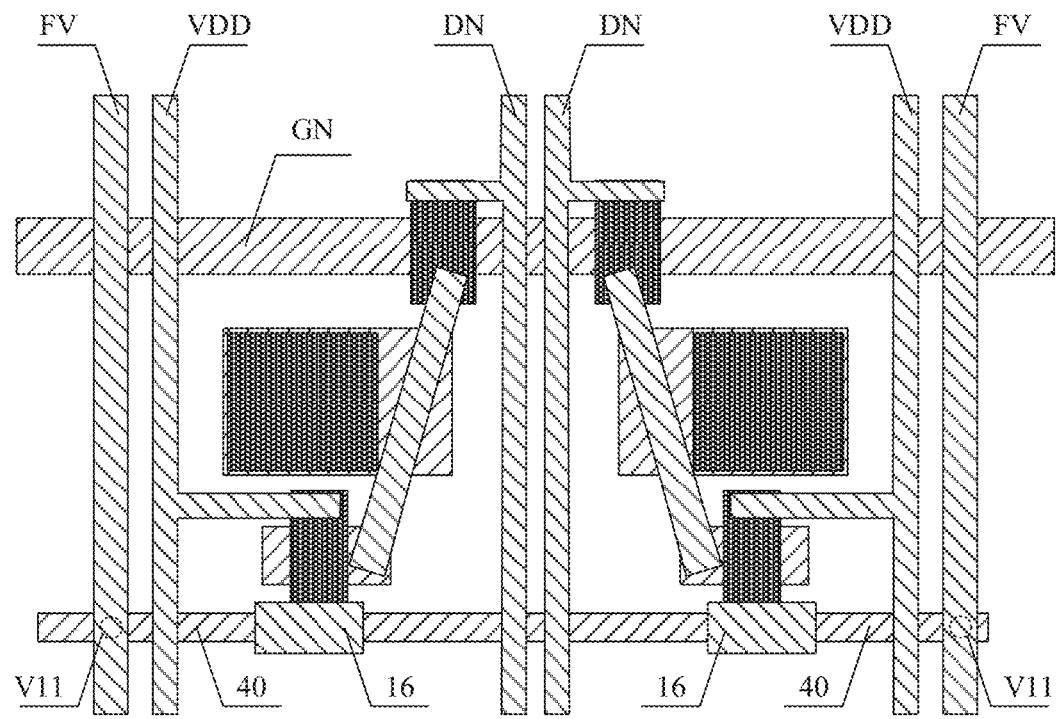
FIG. 26 is a schematic structural diagram of another display substrate according to an embodiment of the present disclosure.

FIG. 26 is a schematic structural diagram of another embodiment of a display substrate according to the present disclosure. This embodiment is an extension of the embodiments shown in FIGS. 24 and 25. The main structure of the display substrate of this embodiment is basically the same as that of the embodiments shown in FIGS. 24 and 25. The repair electrode 40 is arranged on the same layer as the gate line, and the first drain electrode 16 is arranged on the same layer as the auxiliary cathode line FV. A first insulating layer 12 and a second insulating layer 14 are provided for spacing between the repair electrode 40 and the first drain electrode 16 and the auxiliary cathode line FV. The repair electrode 40 has a second overlapping region with the auxiliary cathode line FV, and the auxiliary cathode line FV is connected with the repair electrode 40 through the eleventh via hole. As shown in FIG. 26, the difference is that in the structure of the display substrate of this embodiment, the repair electrode 40 is a longer repair electrode line, which is parallel to the gate line LN and connected with the auxiliary cathode line FV of each pixel through the eleventh via hole V11, and the repair electrode lines and the auxiliary cathode lines form a grid structure.

Figure 27:
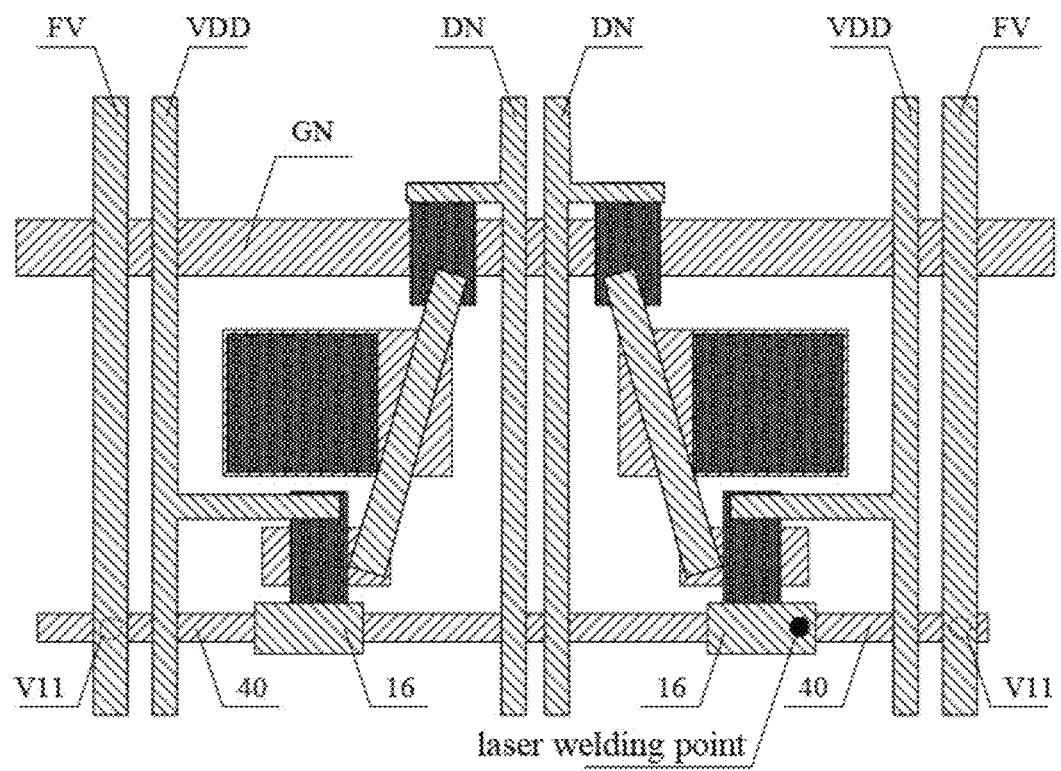
FIG. 27 is a schematic diagram of repairing a defective bright spot for the display substrate shown in FIG. 26.

FIG. 27 is a schematic diagram of repairing a defective bright spot according to this embodiment. As shown in FIG. 27, when a pixel (such as the right pixel) of the display substrate needs to be repaired due to occurrence of a defective bright spot, laser irradiation is performed on the first overlapping region of the right pixel from the side of the substrate 10 far away from the driving circuit layer. The laser irradiation causes the repair electrode 40 to be connected with the first drain electrode 16, so that the first drain electrode 16 of the right pixel and the auxiliary cathode line FV are conducted through the repair electrode 40, that is, the reflective anode 41 is short-circuited with the transparent cathode 44, thereby repairing the bright spot into a dark spot.

The preparation process of the display substrate in this embodiment is basically the same as that of the previous embodiments shown in FIGS. 24 and 25, except that the repair electrode 40 parallel to the gate line is formed in step (1), and extends all pixels in the row, and when the second insulating layer 14 is formed in step (3), an eleventh via hole exposing the repair electrode 40 is formed in each pixel, and the eleventh via hole exposes a surface of the repair electrode 40. In this way, a plurality of auxiliary cathode lines FV formed in step (4) may all be connected with the repair electrodes 40 through the eleventh via holes.

This embodiment may also effectively repair the defective bright spots of the top emission type display substrate, with high repair success rate, and may simplify the repair process, which only needs laser welding at one position. The connection between the auxiliary cathode line and the repair electrode will not affect the normal operation of the pixel driving circuit. In addition, because the repair electrode line is connected with the auxiliary cathode line of each pixel, the repair electrode lines extending in the row direction and the auxiliary cathode lines extending in the column direction form an interconnected grid structure, which greatly reduces the resistance of the auxiliary cathode, effectively reduces the resistance voltage drop and improves the display quality.

In other embodiments, the technical solutions of the foregoing embodiments may be expanded in many ways. For example, as one implementation solution, the repair electrode may be arranged in other film layers, such as in the same layer as the shielding layer. As another implementation solution, the repair electrode may be independently arranged in one film layer and prepared by a single patterning process, which is not limited in this disclosure. All of the above expansions may achieve high success rate in repairing a defective bright spot of the top emission type display substrate.

An embodiment of the present disclosure provides a preparation method of a display substrate. The preparation method of a display substrate includes:

forming a driving circuit layer including a driving transistor, an auxiliary cathode line and a repair electrode on a substrate, wherein the repair electrode is arranged to connect a drain electrode of the driving transistor with the auxiliary cathode line when repairing a defective bright spot; and forming a light-emitting structure layer on the driving circuit layer, wherein an anode of the light-emitting structure layer is connected with a drain electrode of the driving transistor, and a cathode of the light-emitting structure layer is connected with the auxiliary cathode line.

In the action of forming the driving circuit layer including the driving transistor, the auxiliary cathode line and the repair electrode on the substrate, the repair electrode is formed in a first structural layer, a drain electrode of the driving transistor and the auxiliary cathode line are formed in a second structural layer, an insulating layer is formed between the first structural layer and the second structural layer, the repair electrode and the drain electrode of the driving transistor have a first overlapping region, and the repair electrode and the auxiliary cathode line have a second overlapping region.

The repair electrode is arranged in the same layer as a gate line and formed by the same patterning process, and the auxiliary cathode line and the drain electrode of the driving transistor are arranged in the same layer as a data line and formed by the same patterning process.

In the action of forming the driving circuit layer including the driving transistor, the auxiliary cathode line and the repair electrode on the substrate, a via hole is formed in the first overlapping region, and the drain electrode of the driving transistor is connected with the repair electrode through the via hole.

The action of forming the driving circuit layer including the driving transistor, the auxiliary cathode line and the repair electrode on the substrate, a via hole is formed in the second overlapping region, and the auxiliary cathode line is connected with the repair electrode through the via hole.

The repair electrode is a repair electrode line, which is parallel to the gate line, and the repair electrode lines form a grid structure with the auxiliary cathode lines.

In the action of forming the driving circuit layer including the driving transistor, the auxiliary cathode line and the repair electrode on the substrate, a switching transistor and a storage capacitor are also formed, the driving transistor and the switching transistor have a bottom gate structure. In the action of forming the light-emitting structure layer on the driving circuit layer, the light-emitting structure layer is a top emission structure, an anode of the light-emitting structure layer is a reflective anode, and a cathode of the light-emitting structure lay is a transparent cathode.

According to the preparation method of the display substrate provided by the embodiment of the present disclosure, the repair electrode is pre-arranged, and is used to connect the drain electrode of the driving transistor with the auxiliary cathode line when there is a defective bright spot, so as to repair the bright spot into a dark spot, which not only effectively repairs the defective bright spot of the top emission type display substrate, avoids product scrapping, and improves the product yield, but also has high repair success rate and causes no damage to the pixel driving circuit and other defects. Therefore, it can be used in actual production and has good application prospects.

The preparation process of the display substrate has been described in detail in the previous embodiments and will not be repeated here.

An embodiment of the present application further provides a repair method of a display substrate. In the repair method of the display substrate, the display substrate includes a driving circuit layer and a light-emitting structure layer which are stacked on a substrate, the driving circuit layer includes a driving transistor, an auxiliary cathode line and a repair electrode, an anode of the light-emitting structure layer is connected with a drain electrode of the driving transistor, and a cathode of the light-emitting structure layer is connected with the auxiliary cathode line; when repairing a defective bright spot, the repair method includes: connecting the drain electrode of the driving transistor with the auxiliary cathode line by using the repair electrode.

In an exemplary embodiment, the repair electrode is arranged in a first structural layer, the drain electrode of the driving transistor and the auxiliary cathode line are arranged in a second structural layer, and an insulating layer is arranged between the first structural layer and the second structural layer. The repair electrode and the drain electrode of the driving transistor have a first overlapping region, and the repair electrode and the auxiliary cathode line have a second overlapping region. The action of connecting the drain electrode of the driving transistor with the auxiliary cathode line by using the repair electrode includes:

irradiating the first overlapping region and the second overlapping region with laser from a side of the substrate far away from the driving circuit layer, welding and connecting the repair electrode with the drain electrode of the driving transistor, and welding and connecting the repair electrode with the auxiliary cathode line.

In an exemplary embodiment, the repair electrode is arranged in a first structural layer, the drain electrode of the driving transistor and the auxiliary cathode line are arranged in a second structural layer, an insulating layer is arranged between the first structural layer and the second structural layer, the repair electrode is connected with the drain electrode of the driving transistor through a via hole, and the repair electrode and the auxiliary cathode line have a second overlapping region. The action of connecting the drain electrode of the driving transistor with the auxiliary cathode line by using the repair electrode includes:

irradiating the second overlapping region with laser from a side of the substrate far away from the driving circuit layer, and welding and connecting the repair electrode with the auxiliary cathode line.

In an exemplary embodiment, the repair electrode is arranged in a first structural layer, the drain electrode of the driving transistor and the auxiliary cathode line are arranged in a second structural layer, an insulating layer is arranged between the first structural layer and the second structural layer, the repair electrode and the drain electrode of the driving transistor have a first overlapping region, the repair electrode is connected with the auxiliary cathode line through a via hole. The action of connecting the drain electrode of the driving transistor with the auxiliary cathode line by using the repair electrode includes:

irradiating the first overlapping region with laser from a side of the substrate far away from the driving circuit layer, and welding and connecting the repair electrode with the drain electrode of the driving transistor.

In an exemplary embodiment, a power of laser irradiation may be 50 mW to 100 mW.

According to the repair method of the display substrate provided by the embodiment of the present disclosure, the repair electrode is pre-arranged, and is used to connect the drain electrode of the driving transistor with the auxiliary cathode line when there is a defective bright spot, so as to repair the bright spot into a dark spot, which not only effectively repairs the defective bright spot of the top emission type display substrate, avoids product scrapping, and improves the product yield, but also has high repair success rate and causes no damage to the pixel driving circuit and other defects. Therefore, it can be used in actual production and has good application prospects.

The repair process of the display substrate has been described in detail in the previous embodiments and will not be repeated here.

An embodiment of the disclosure further provides a display device, including the display substrate according to an aforementioned embodiment. The display device may be any product or component with a display function such as a mobile phone, a tablet computer, a television, a display, a notebook computer, a digital photo frame, or a navigator, etc.

In the description of the present disclosure, it should be understood that an orientation or position relationship indicated by the terms "middle", "upper", "lower", "front", "rear", "vertical", "horizontal", "top", "bottom", "inner", "outer" and the like is based on the orientation or position relationship shown in the accompanying drawings, which is only for the convenience of describing the present disclosure and simplifying the description, rather than indicating or implying that the apparatus or element referred to must have the specific orientation, or be constructed and operated in the specific orientation, and thus cannot be interpreted as a limitation on the present disclosure.

In the description of the embodiments of the present disclosure, it should be noted that unless otherwise clearly specified and defined, the terms "install", "couple", "connect" should be broadly interpreted, for example, it may be a fixed connection, or a detachable connection, or an integrated connection; it may be a mechanical connection or an electrical connection; it may be a direct connection, or may be an indirect connection through an intermediary, or may be an internal connection between two elements. Those of ordinary skills in the art can understand the specific meanings of the above mentioned terms in the present disclosure according to specific context.

Although the embodiments disclosed in the present disclosure are as described above, the described contents are only the embodiments for facilitating understanding of the present disclosure, which are not intended to limit the present disclosure. A person skilled in the art to which the present disclosure pertains may make any modifications and variations in the form and details of implementation without departing from the spirit and scope of the present disclosure. Nevertheless, the scope of patent protection of the present disclosure shall still be determined by the scope defined by the appended claims.

What is claimed is:

1. A display substrate, comprising:
a driving circuit layer and a light-emitting structure layer which are stacked on a substrate, wherein the driving circuit layer comprises a driving transistor, an auxiliary cathode line and a repair electrode, an anode of the light-emitting structure layer is connected with a drain electrode of the driving transistor, a cathode of the light-emitting structure layer is connected with the auxiliary cathode line, the repair electrode is arranged to connect the drain electrode of the driving transistor with the auxiliary cathode line when repairing a defective bright spot,
wherein the repair electrode is arranged in a first structural layer, the drain electrode of the driving transistor and the auxiliary cathode line are arranged in a second structural layer, an insulating layer is arranged between the first structural layer and the second structural layer, the repair electrode and the drain electrode of the driving transistor have a first overlapping region, and the repair electrode and the auxiliary cathode line have a second overlapping region,
wherein the drain electrode and the auxiliary cathode line are arranged on a same layer as data lines, and formed of a same material and by a same patterning process,
wherein the insulating layer comprises a first insulating layer and a second insulating layer,
wherein the first insulating layer covers gate lines, a first gate electrode, a second gate electrode, a first capacitor electrode and the repair electrode,
wherein a first active layer, a second active layer and a second capacitor electrode are arranged on the first insulating layer, and
wherein the second insulating layer covers the first active layer, the second active layer and the second capacitor electrode.

2. The display substrate according to claim 1, wherein the repair electrode is arranged in a same layer as the gate lines.

3. The display substrate according to claim 1, wherein the first overlapping region is provided with a via hole, and the drain electrode of the driving transistor is connected with the repair electrode through the via hole.

4. The display substrate according to claim 1, wherein the second overlapping region is provided with a via hole, and the auxiliary cathode line is connected with the repair electrode through the via hole.

5. The display substrate according to claim 4, wherein the repair electrode is a repair electrode line, which is parallel to a gate lines, a plurality of repair electrode lines and a plurality of auxiliary cathode lines of the driving circuit layer form a grid structure.

6. The display substrate according to claim 1, wherein the driving circuit layer further comprises a switching transistor and a storage capacitor, the driving transistor and the switching transistor have a bottom gate structure respectively and the light-emitting structure layer has a top emission structure.

7. A display device, comprising the display substrate according to claim 1.

8. A preparation method for a display substrate, comprising:
forming a driving circuit layer comprising a driving transistor, an auxiliary cathode line and a repair electrode on a substrate, wherein the repair electrode is arranged to connect a drain electrode of the driving transistor with the auxiliary cathode line when repairing a defective bright spot; and forming a light-emitting structure layer on the driving circuit layer, wherein an anode of the light-emitting structure layer is connected with a drain electrode of the driving transistor, and a cathode of the light-emitting structure layer is connected with the auxiliary cathode line, wherein forming the driving circuit layer comprising the driving transistor, the auxiliary cathode line and the repair electrode on the substrate comprises:

forming the repair electrode in a first structural layer;

forming the drain electrode of the driving transistor and the auxiliary cathode line in a second structural layer; and forming an insulating layer between the first structural layer and the second structural layer, wherein the repair electrode and the drain electrode of the driving transistor have a first overlapping region, and the repair electrode and the auxiliary cathode line have a second overlapping region, wherein the drain electrode and the auxiliary cathode line are arranged on a same layer as data lines, and formed of a same material and by a same patterning process, wherein the insulating layer comprises a first insulating layer and a second insulating layer, wherein the first insulating layer covers gate lines, a first gate electrode, a second gate electrode, a first capacitor electrode and the repair electrode, wherein a first active layer, a second active layer and a second capacitor electrode are arranged on the first insulating layer, and wherein the second insulating layer covers the first active layer, the second active layer and the second capacitor electrode.

9. The preparation method according to claim 8, wherein the repair electrode is arranged in a same layer as the gate lines and formed by a same patterning process as the gate lines.

10. The preparation method according to claim 8, wherein the forming the driving circuit layer comprising the driving transistor, the auxiliary cathode line and the repair electrode on the substrate comprises:

forming a via hole in the first overlapping region, and the drain electrode of the driving transistor is connected with the repair electrode through the via hole.

11. The preparation method according to claim 8, wherein the forming the driving circuit layer comprising the driving transistor, the auxiliary cathode line and the repair electrode on the substrate comprise:

forming a via hole in the second overlapping region, and the auxiliary cathode line is connected with the repair electrode through the via hole.

12. The preparation method according to claim 11, wherein the repair electrode is a repair electrode line, the repair electrode line is parallel to the gate lines, a plurality of repair electrode lines and a plurality of auxiliary cathode lines of the driving circuit layer form a grid structure.

13. The preparation method according to claim 8, wherein the forming the driving circuit layer comprising the driving transistor, the auxiliary cathode line and the repair electrode on the substrate comprises:

forming a switching transistor and a storage capacitor, wherein the driving transistor and the switching transistor have a bottom gate structure respectively; and the light-emitting structure layer formed on the driving circuit layer is a top emission structure.

14. A repair method for a display substrate, wherein the display substrate comprises a driving circuit layer and a light-emitting structure layer which are stacked on a substrate, the driving circuit layer comprising a driving transistor, an auxiliary cathode line and a repair electrode, an anode of the light-emitting structure layer being connected with a drain electrode of the driving transistor, and a cathode of the light-emitting structure layer being connected with the auxiliary cathode line; when repairing a defective bright spot, the repair method comprising:

connecting the drain electrode of the driving transistor with the auxiliary cathode line by using the repair electrode, wherein the repair electrode is arranged in a first structural layer, the drain electrode of the driving transistor and the auxiliary cathode line are arranged in a second structural layer, an insulating layer is arranged between the first structural layer and the second structural layer, the repair electrode and the drain electrode of the driving transistor have a first overlapping region, and the repair electrode and the auxiliary cathode line have a second overlapping region;

wherein the drain electrode and the auxiliary cathode line are arranged on a same layer as data lines, and formed of a same material and by a same patterning process;

wherein the insulating layer comprises a first insulating layer and a second insulating layer;

wherein the first insulating layer covers gate lines, a first gate electrode, a second gate electrode, a first capacitor electrode and the repair electrode;

wherein a first active layer, a second active layer and a second capacitor electrode are arranged on the first insulating layer; and wherein the second insulating layer covers the first active layer, the second active layer and the second capacitor electrode.

15. The repair method according to claim 14, wherein connecting the drain electrode of the driving transistor with the auxiliary cathode line by using the repair electrode comprises:

irradiating the first overlapping region and the second overlapping region with laser from a side of the substrate away from the driving circuit layer, welding the repair electrode with the drain electrode of the driving transistor, and welding the repair electrode with the auxiliary cathode line.

16. The repair method according to claim 15, wherein a power of the laser irradiation is 50 mW to 100 mW.

17. The repair method according to claim 14, wherein the repair electrode is connected with the drain electrode of the driving transistor through a via hole, and connecting the drain electrode of the driving transistor with the auxiliary cathode line by using the repair electrode comprises:

irradiating the second overlapping region with laser from a side of the substrate away from the driving circuit layer, and welding the repair electrode with the auxiliary cathode line.

18. The repair method according to claim 14, wherein the repair electrode is connected with the auxiliary cathode line through a via hole; and connecting the drain electrode of the driving transistor with the auxiliary cathode line by using the repair electrode comprises:

irradiating the first overlapping region with laser from a side of the substrate away from the driving circuit layer, and welding the repair electrode with the drain electrode of the driving transistor.

\* \* \* \* \*